(12) United States Patent
Wieland

(10) Patent No.: US 12,671,053 B2
(45) Date of Patent: Jun. 30, 2026

(54) METHOD OF COMPENSATING FOR AN EFFECT OF ELECTRODE DISTORTION, ASSESSMENT SYSTEM

(71) Applicant: ASML Netherlands B.V., Veldhoven (NL)

(72) Inventor: Marco Jan-Jaco Wieland, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 334 days.

(21) Appl. No.: 18/534,455

(22) Filed: Dec. 8, 2023

(65) Prior Publication Data

US 2024/0105416 A1     Mar. 28, 2024

Related U.S. Application Data

(63) Continuation of application No. PCT/EP2022/062579, filed on May 10, 2022.

(51) Int. Cl.
H01J 37/12 (2006.01)
H01J 37/153 (2006.01)
H01J 37/244 (2006.01)

(52) U.S. Cl.
CPC ............ H01J 37/12 (2013.01); H01J 37/153 (2013.01); H01J 37/244 (2013.01); *H01J 2237/1534* (2013.01)

(58) Field of Classification Search
CPC ........ H01J 37/12; H01J 37/153; H01J 37/244; H01J 2237/1534; H01J 2237/1205; H01J 2237/2817
USPC ....................................... 250/396 R
See application file for complete search history.

(56) References Cited

U.S. PATENT DOCUMENTS

| | | |
|---|---|---|
| 2003/0001095 A1 | 1/2003 | Lo et al. |
| 2011/0068276 A1* | 3/2011 | Kruit ...................... H01J 37/12 |
| | | 250/396 R |
| 2012/0091318 A1 | 4/2012 | Wieland et al. |
| 2013/0341526 A1 | 12/2013 | Ohashi |
| 2020/0126751 A1 | 4/2020 | Kemen et al. |

FOREIGN PATENT DOCUMENTS

| | | |
|---|---|---|
| DE | 10 2018 124223 A1 | 4/2020 |
| EP | 1602121 A2 | 12/2005 |
| EP | 2425444 A1 | 3/2012 |

(Continued)

OTHER PUBLICATIONS

PCT International Search Report, corresponding with a PCT Application No. PCT/EP2022/062579, mailed on Sep. 15, 2022. (2 pages).

*Primary Examiner* — Michael Maskell
(74) *Attorney, Agent, or Firm* — Finnegan, Henderson, Farabow, Garrett & Dunner LLP

(57) ABSTRACT

Assessment systems and methods are disclosed. In one arrangement, an effect of electrode distortion in an objective lens array is compensated. An electrode distortion is adjusted by varying an electrostatic field in the objective lens array. The adjustment is such as to compensate for an effect of electrode distortion on sub-beams of a multi-beam impinging on a sample. A sub-beam is refocused in response to the variation in electrostatic field in the objective lens array. The adjusting and the refocusing comprises changing potentials applied to at least two electrodes of the objective lens array.

20 Claims, 10 Drawing Sheets

(56) References Cited

FOREIGN PATENT DOCUMENTS

| EP | 2702595 | A1 | 3/2014 |
| EP | 2715768 | A2 | 4/2014 |
| EP | 4086933 | A1 | 11/2022 |
| EP | 4244881 | | 9/2023 |
| JP | S6042825 | A | 3/1985 |
| JP | 2009505368 | A | 2/2009 |
| JP | 2012123971 | A | 6/2012 |
| JP | 2013505575 | A | 2/2013 |
| JP | 2013196951 | A | 9/2013 |
| JP | 2018526778 | A | 9/2018 |
| TW | 201833967 | A | 9/2018 |
| TW | 202113902 | A | 4/2021 |

* cited by examiner

Fig. 6
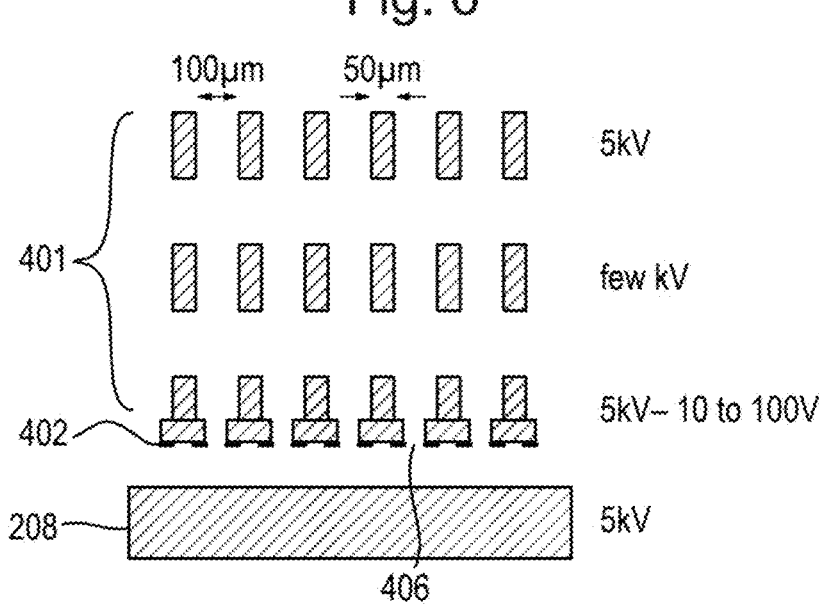
Fig. 7
Fig. 8
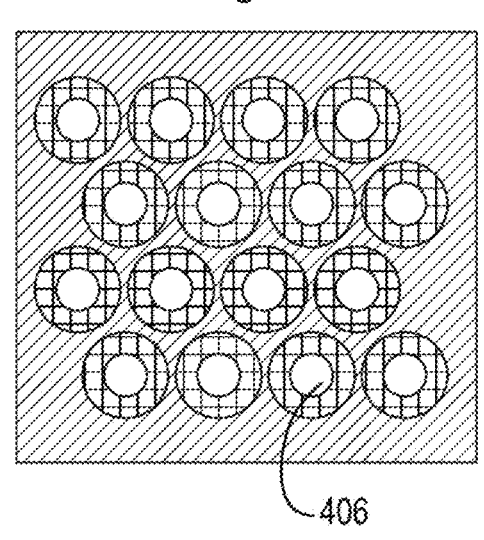
Fig. 9
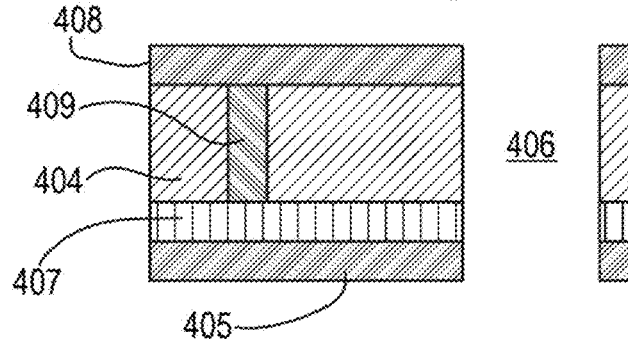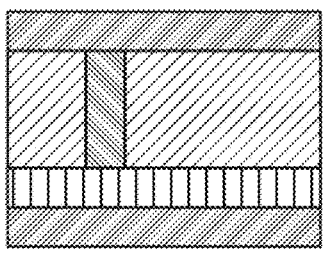

Fig. 11

Fig. 12
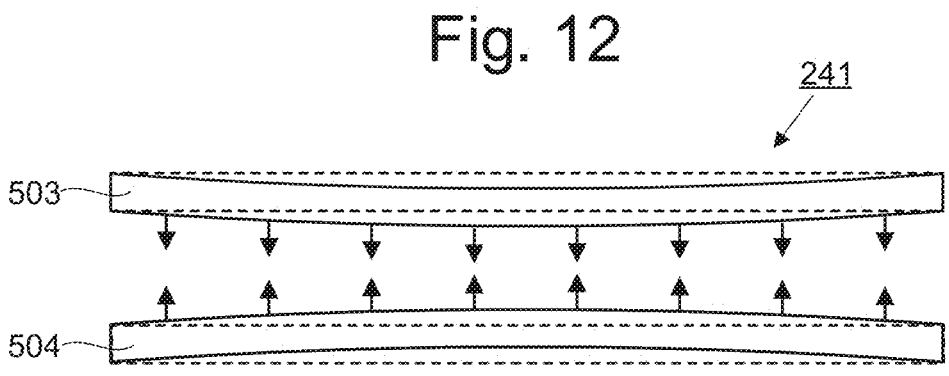
503
241
504
Fig. 13
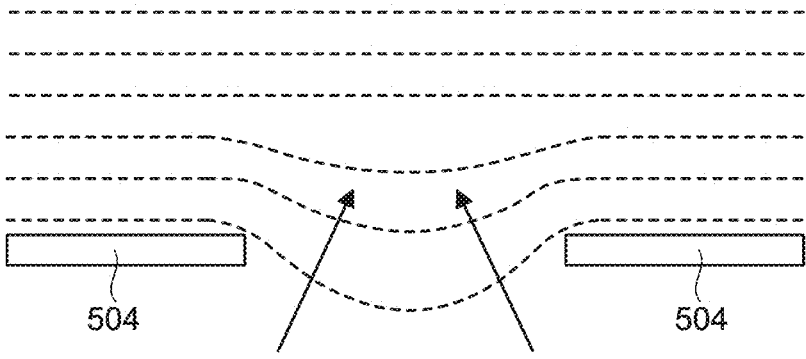
504
504
Fig. 14
503 (V1)
241
$E1\updownarrow$
504 (V2)
555 (V2)
$E2$
208 (Vs)
f1
f2

METHOD OF COMPENSATING FOR AN EFFECT OF ELECTRODE DISTORTION, ASSESSMENT SYSTEM

CROSS-REFERENCE TO RELATED APPLICATIONS

This application claims priority of International application PCT/EP2022/062579, filed on 10 May 2022, which claims priority of EP application 21178810.4, filed on 10 Jun. 2021, all of which are incorporated herein by reference in their entireties.

FIELD

The embodiments provided herein relate to methods and assessment systems that use charged particles, particularly electrons, to assess a sample, for example by detecting signal electrons emitted from the sample.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an important process during and/or after its manufacture.

Pattern inspection tools with a charged particle beam have been used to inspect objects, which may be referred to as samples, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause signal electrons to be emitted from the surface, such as secondary electrons, backscattered electrons or Auger electrons. The signal electrons may be emitted from the material structure of the sample. By scanning the primary electron beam as the probing spot over the sample surface, signal electrons can be emitted across the surface of the sample. By collecting these emitted signal electrons from the sample surface, a pattern inspection tool may obtain an image representing characteristics of the material structure of the surface of the sample.

There is a general need to improve control of charged particle beams in assessment systems and methods.

SUMMARY

It is an object of the present disclosure to improve control of charged particle beams in assessment systems and methods.

According to some embodiments of the present disclosure, there is provided a method of compensating for an effect of electrode distortion in an objective lens array of a multi-beam charged particle assessment system, the method comprising: adjusting an electrode distortion by varying an electrostatic field in the objective lens array, the objective lens array comprising a hardware correction for compensating a predicted effect on the sub-beams from a predicted electrode distortion in the objective lens array, the adjustment being such as to compensate for an effect of electrode distortion on sub-beams of the multi-beam impinging on a sample; and refocusing a sub-beam of the multi-beam in response to the variation in electrostatic field in the objective lens array, wherein: the adjusting and the refocusing comprises changing potentials applied to two electrodes of the objective lens array and the adjustment of the electrode distortion comprising adjusting the electrode distortion to substantially match the predicted electrode distortion.

BRIEF DESCRIPTION OF FIGURES

The above and other aspects of the present disclosure will become more apparent from the description of exemplary embodiments, taken in conjunction with the accompanying drawings.

FIG. 6 is a schematic cross-sectional view of a portion of an objective lens array of an exemplary arrangement.

FIG. 7 is bottom view of the portion of the objective lens array of FIG. 6.

FIG. 8 is a bottom view of a modified version of the portion of the objective lens array of FIG. 6.

FIG. 9 is an enlarged schematic cross-sectional view of a detector incorporated in the objective lens of FIG. 6.

FIG. 11 is a schematic cross-sectional view of portions of a control lens array and an objective lens array of an assessment system.

FIG. 12 is a schematic cross-sectional view of portions of electrodes in an objective lens array to illustrate electrode distortion (bow).

FIG. 13 is a schematic side sectional view showing equipotential lines in a region near an aperture of an electrode of an objective lens during operation, to illustrate operation of an elementary lens.

FIG. 14 is a schematic side sectional view of portions of electrodes in an objective lens array above a sample where a stage is moved to refocus a sub-beam in response to a variation in electrostatic field in the objective lens array.

DETAILED DESCRIPTION

Figure 1:
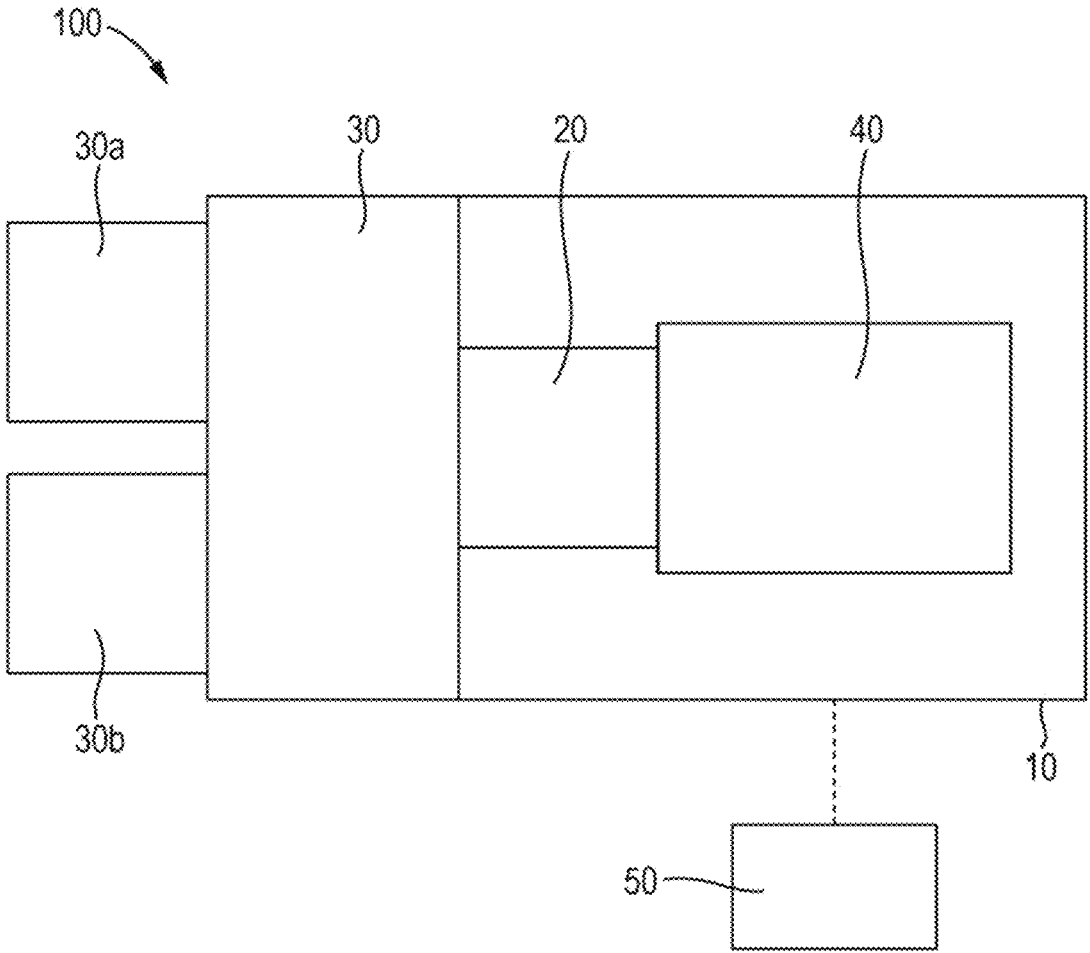
FIG. 1 is a schematic diagram illustrating an exemplary charged particle beam inspection apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than $\frac{1}{1000}^{th}$ of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If each individual step had a yield of 95%, the overall process yield would be as low as 7%.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially true if operator intervention is required for reviewing the defects. Thus, high throughput detection and identification of micro and nano-scale defects by inspection tools (such as a Scanning Electron Microscope ('SEM')) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. Together at least the illumination apparatus, or illumination system, and the projection apparatus, or projection system, may be referred to together as the electron-optical system or apparatus. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

An implementation of a known multi-beam inspection apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam inspection apparatus 100, which may also be referred to as a charged particle beam assessment system or simply assessment system. The charged particle beam inspection apparatus 100 of FIG. 1 includes a main chamber 10, a load lock chamber 20, an electron beam tool 40, an equipment front end module (EFEM) 30 and a controller 50. Electron beam tool 40 is located within main chamber 10.

EFEM 30 includes a first loading port 30a and a second loading port 30b. EFEM 30 may include additional loading port(s). First loading port 30a and second loading port 30b may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas particles in main chamber 10 so that the pressure in around the sample reaches a second pressure lower than the first pressure. After reaching the second pressure, the sample is transported to the electron beam tool by which it may be inspected. An electron beam tool 40 may comprise a multi-beam electron-optical apparatus.

Controller 50 is electronically connected to electron beam tool 40. Controller 50 may be a processor (such as a computer) configured to control the charged particle beam inspection apparatus 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. The controller 50 may be located in one of the component elements of the charged particle beam inspection apparatus or it can be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Figure 2:
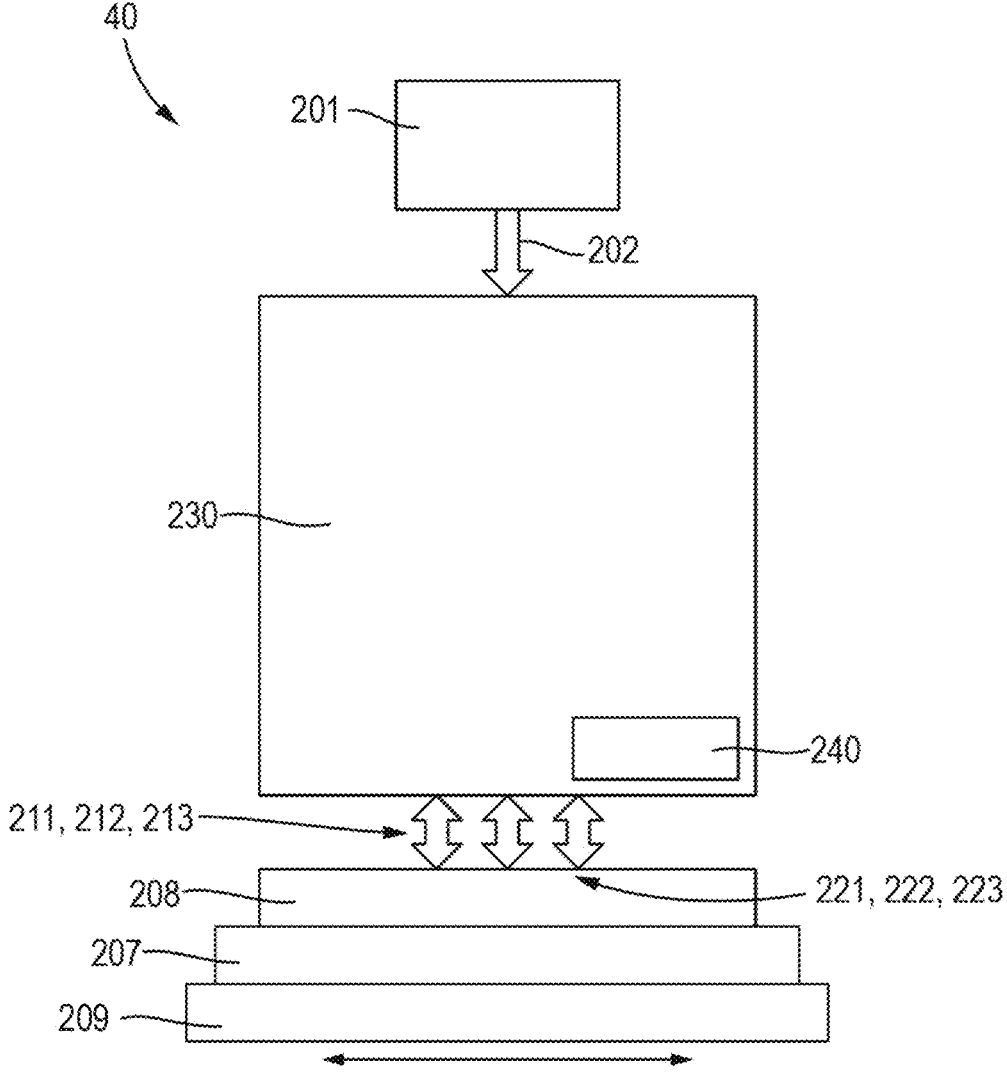
FIG. 2 is a schematic diagram illustrating an exemplary multi-beam apparatus that is part of the exemplary charged particle beam inspection apparatus of FIG. 1.

Reference is now made to FIG. 2, which is a schematic diagram illustrating an exemplary electron beam tool 40 including a multi-beam inspection tool that is part of the exemplary charged particle beam inspection apparatus 100 of FIG. 1. Multi-beam electron beam tool 40 (also referred to herein as apparatus 40) comprises an electron source 201, a projection apparatus 230, a motorized stage 209, and a sample holder 207. The electron source 201 and projection apparatus 230 may together be referred to as an illumination apparatus. The sample holder 207 is supported by motorized or actuated stage 209 so as to hold a sample 208 (e.g., a substrate or a mask) for inspection. Multi-beam electron beam tool 40 further comprises an electron detection device 240.

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202.

Projection apparatus 230 is configured to convert primary electron beam 202 into a plurality of sub-beams 211, 212, 213 and to direct each sub-beam onto the sample 208. Although three sub-beams are illustrated for simplicity, there may be many tens, many hundreds, many thousands, many tens of thousands, or even hundreds of thousands (or more) of sub-beams. The sub-beams may be referred to as beamlets.

Controller 50 may be connected to various parts of charged particle beam inspection apparatus 100 of FIG. 1, such as electron source 201, electron detection device 240, projection apparatus 230, and motorized stage 209. Controller 50 may perform various image and signal processing functions. Controller 50 may also generate various control signals to govern operations of the charged particle beam inspection apparatus, including the charged particle multi-beam apparatus.

Projection apparatus 230 may be configured to focus sub-beams 211, 212, and 213 onto a sample 208 for inspection and may form three probe spots 221, 222, and 223 on the surface of sample 208. Projection apparatus 230 may be configured to deflect primary sub-beams 211, 212, and 213 to scan probe spots 221, 222, and 223 across individual scanning areas in a section of the surface of sample 208. In response to incidence of primary sub-beams 211, 212, and 213 on probe spots 221, 222, and 223 on sample 208, electrons are generated from the sample 208 which include secondary electrons and backscattered electrons which may be referred to as signal particles. The secondary electrons typically have electron energy ≤50 eV and backscattered electrons typically have electron energy between 50 eV and the landing energy of primary sub-beams 211, 212, and 213.

Electron detection device 240 is configured to detect secondary electrons and/or backscattered electrons and to generate corresponding signals which are sent to controller 50 or a signal processing system (not shown), e.g. to construct images of the corresponding scanned areas of sample 208. Electron detection device may be incorporated into the projection apparatus or may be separate therefrom, with a secondary optical column being provided to direct secondary electrons and/or backscattered electrons to the electron detection device.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to an electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of sample 208. The reconstructed images can thereby be used to reveal any defects that may exist in the sample.

The controller 50 may control motorized stage 209 to move sample 208 during inspection of sample 208. The controller 50 may enable motorized stage 209 to move sample 208 in a direction, preferably continuously, for example at a constant speed, at least during sample inspection. The controller 50 may control movement of the motorized stage 209 so that it changes the speed of the movement of the sample 208 dependent on various parameters. For example, the controller may control the stage speed (including its direction) depending on the characteristics of the inspection steps and/or scans of the scanning process for example as disclosed in EPA 21171877.0 filed 3 May 2021 which is hereby incorporated in so far as the combined stepping and scanning strategy at least of the stage.

Figure 3:
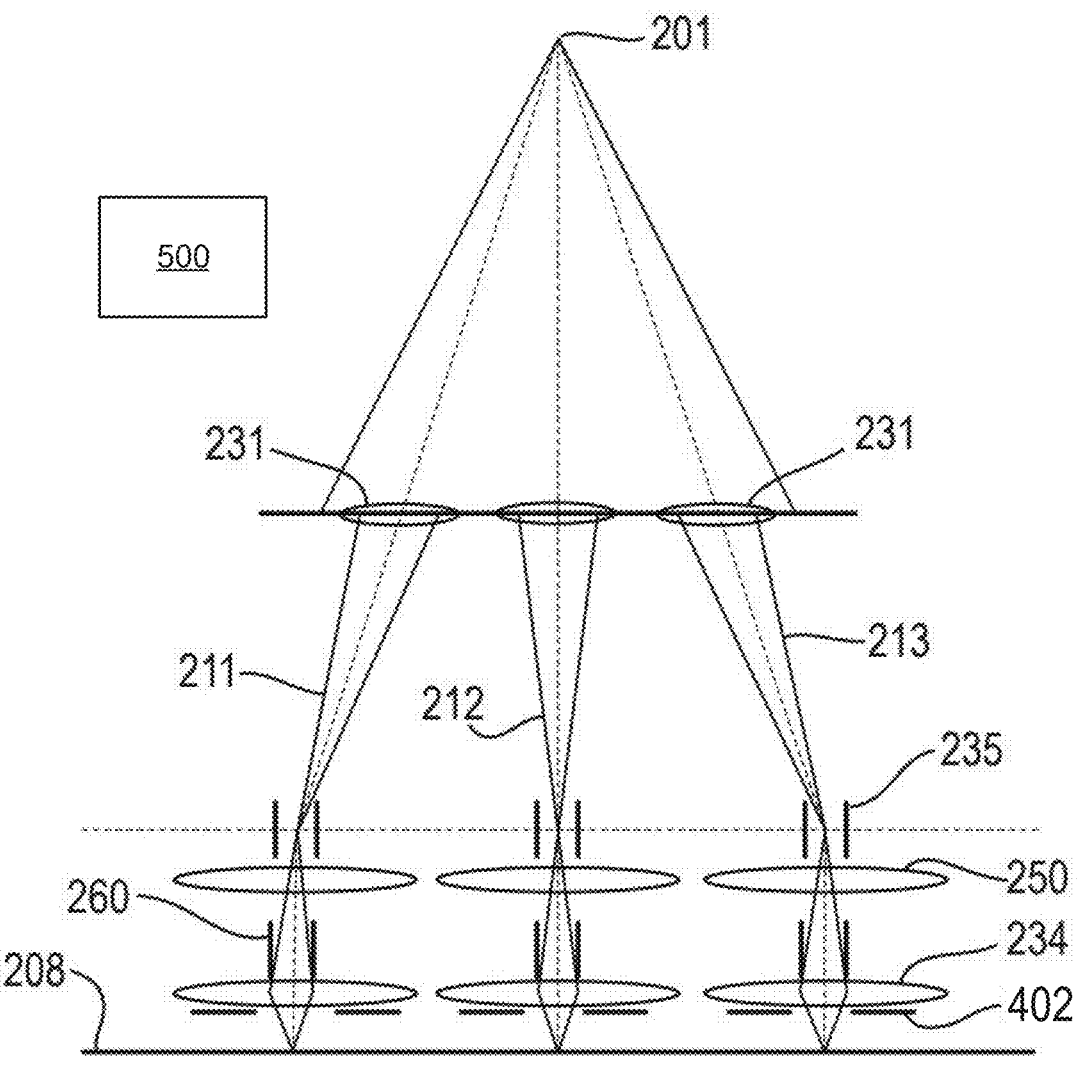
FIG. 3 is a schematic diagram of an exemplary electron-optical column comprising a condenser lens array.

FIG. 3 is a schematic diagram of an exemplary electron-optical column for use in an assessment system. For ease of illustration, lens arrays are depicted schematically herein by arrays of oval shapes. Each oval shape represents one of the lenses in the lens array. The oval shape is used by convention to represent a lens, by analogy to the biconvex form often adopted in optical lenses. In the context of charged-particle arrangements such as those discussed herein, it will be understood however that lens arrays will typically operate electrostatically and so may not require any physical elements adopting a biconvex shape. As described below, lens arrays may instead comprise multiple plates with apertures. Each plate with apertures may be referred to as an electrode. The electrodes may be provided in series along sub-beam paths of sub-beams of a multi-beam.

Electron source 201 directs electrons toward an array of condenser lenses 231 forming part of projection system 230. The electron source is desirably a high brightness thermal field emitter with a good compromise between brightness and total emission current. There may be many tens, many hundreds or many thousands or even tens of thousands of condenser lenses 231. Condenser lenses of array 231 may comprise multi-electrode lenses and have a construction based on EP1602121A1, which document is hereby incorporated by reference in particular to the disclosure of a lens array to split an e-beam into a plurality of sub-beams, with the array providing a lens for each sub-beam. The condenser lens array may take the form of at least two, preferably three, plates, acting as electrodes, with apertures in each plate aligned with apertures in other plates to define paths for sub-beams through the plates. At least two of the plates are maintained during operation at different potentials to achieve the desired lensing effect. Between the plates of the condenser lens array are electrically insulating plates for example made of an insulating material such as ceramic or glass, with one or more apertures for the sub-beams. In an alternative arrangement, one or more of the plates may feature apertures that each have their own electrode, for example with an array of electrodes around their perimeter or arranged in groups of apertures having a common electrode.

In an arrangement the condenser lens array is formed of three plate arrays in which charged particles have the same energy as they enter and leave each lens, which arrangement may be referred to as an Einzel lens. Thus, dispersion only occurs within the Einzel lens itself (between entry and exit electrodes of the lens), thereby limiting off-axis chromatic aberrations. When the thickness of the condenser lenses is low, e.g. a few mm, such aberrations have a small or negligible effect.

Each condenser lens in the array directs electrons into a respective sub-beam 211, 212, 213 which is focused at a respective intermediate focus 233. A collimator or an array of collimators may be positioned to operate on the respective intermediate focus 233. The collimators may take the form of deflectors 235 provided at the intermediate focuses 233. Deflectors 235 are configured to bend a respective beamlet 211, 212, 213 by an amount effective to ensure that the principal ray (which may also be referred to as the beam axis) is incident on the sample 208 substantially normally (i.e. at substantially 90° to the nominal surface of the sample).

Below (i.e. downbeam or further from source 201) deflectors 235 there is a control lens array 250 comprising a control lens 251 for each sub-beam 211, 212, 213. Control lens array 250 may comprise two or more, preferably at least three, plate electrode arrays connected to respective potential sources, preferably with insulating plates in contact with the electrodes for example between the electrodes. Each of the plate electrode arrays may be referred to as a control electrode. A function of control lens array 250 is to optimize the beam opening angle with respect to the demagnification of the beam and/or to control the beam energy delivered to the objective lenses 234, each of which directs a respective sub-beam 211, 212, 213 onto the sample 208.

Optionally an array of scan deflectors 260 is provided between the control lens array 250 and the array of objective lenses 234 (objective lens array). The array of scan deflectors 260 comprises a scan deflector 261 for each sub-beam 211, 212, 213. Each scan deflector is configured to deflect a respective sub-beam 211, 212, 213 in one or two directions so as to scan the sub beam across the sample 208 in one or two directions.

A detector module 402 of a detector is provided within or between the objective lenses 234 and the sample 208 to detect signal electrons/particles emitted from the sample 208. An exemplary construction of such a detector module 402 is described below. Note that the detector additionally or alternatively may have detector elements up-beam along the primary beam path of the objective lens array or even the control lens array.

Figure 4:
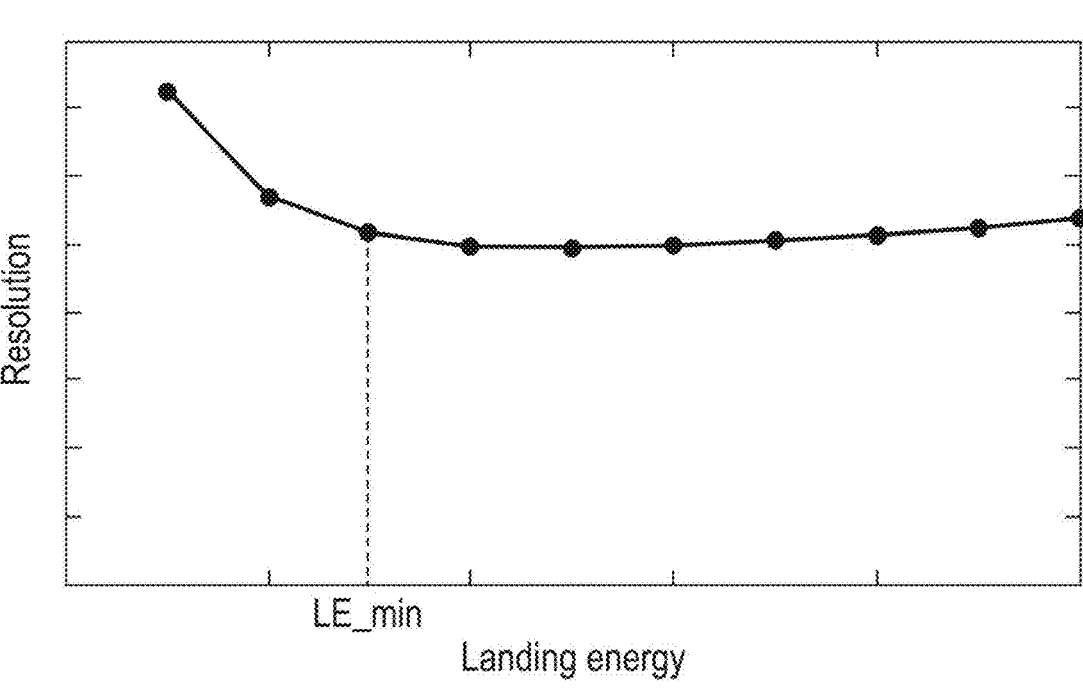
FIG. 4 is a graph of landing energy vs. resolution of an exemplary arrangement.

The system of FIG. 3 is configured to control the landing energy of the electrons on the sample by varying the potentials applied to the electrodes of the control lenses and the objective lenses. The control lenses and objective lenses work together and may be referred to as an objective lens assembly. The landing energy can be selected to increase emission and detection of secondary electrons dependent on the nature of the sample being assessed. A controller may be configured to control the landing energy to any desired value within a predetermined range or to a desired one of a plurality of predetermined values. In some embodiments, the landing energy can be controlled to a desired value in a predetermined range, e.g. from 1000 eV to 5000 eV. FIG. 4 is a graph depicting resolution as a function of landing energy, assuming the beam opening angle/demagnification is re-optimized for changing landing energy. As can be seen, the resolution of the assessment tool can be kept substantially constant with change in landing energy down to a minimum value LE_min. Resolution deteriorates below LE_min because it is necessary to reduce the lens strength of, and electric fields within, the objective lens in order to maintain a minimum spacing between objective lens and/or detector and the sample. Exchangeable modules, as discussed further below, may also be employed to vary or control the landing energy.

Desirably, the landing energy is primarily varied by controlling the energy of the electrons exiting the control lens. The potential differences within the objective lenses are preferably kept constant during this variation so that the electric field within the objective lens remains as high as possible. The potentials applied to the control lens in addition may be used to optimize the beam opening angle and demagnification. The control lens can also be referred to as a refocus lens as it can function to correct the focus position in view of changes in the landing energy. Desirably, each control lens comprises three electrodes so as to provide two independent control variables as further discussed below. For example, one of the electrodes can be used to control demagnification while a different electrode can be used to independently control landing energy. Alternatively each control lens may have only two electrodes. When there are only two electrodes, in contrast, one of the electrodes may need to control both demagnification and landing energy.

Figure 5:
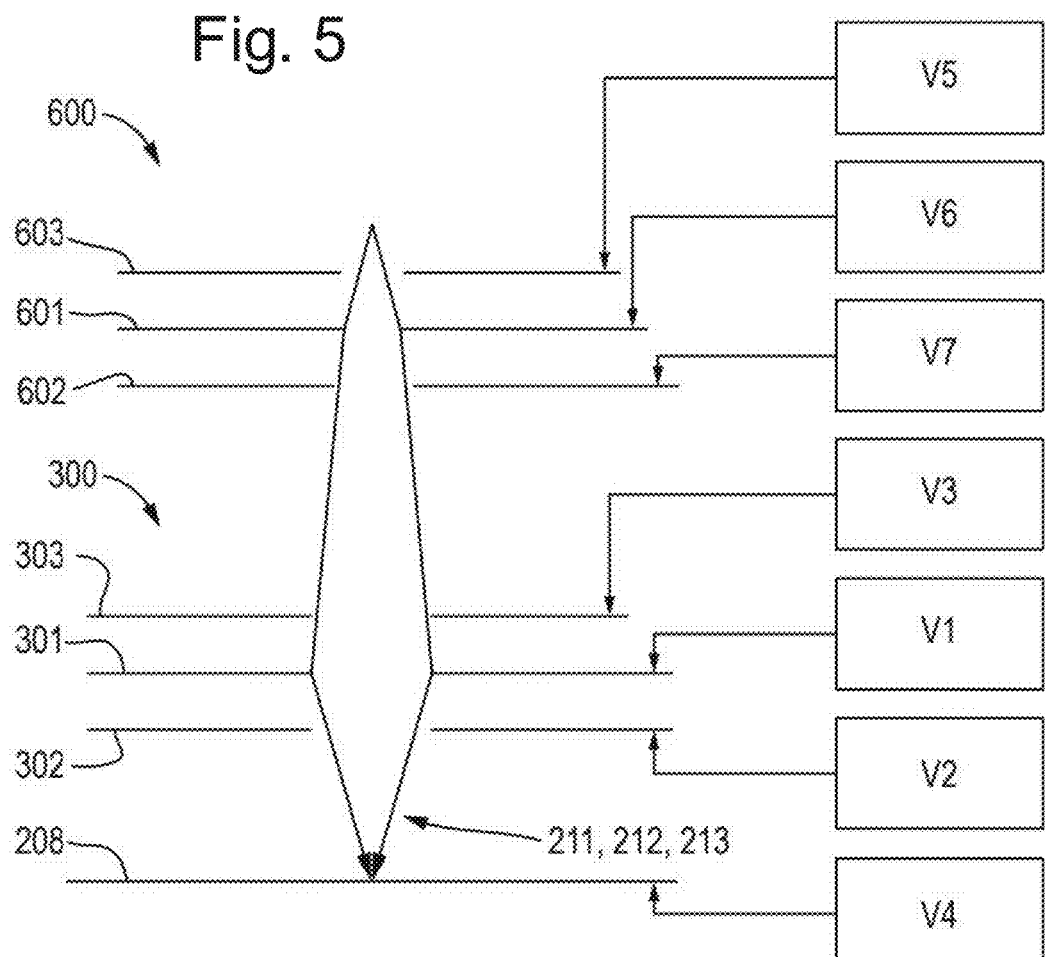
FIG. 5 is an enlarged diagram of an objective lens and a control lens.

FIG. 5 is an enlarged schematic view of one objective lens 300 of the objective lens array and one control lens 600 of the control lens array 250. Objective lens 300 can be configured to demagnify the electron beam by a factor greater than 10, desirably in the range of 50 to 100 or more. The objective lens comprises a middle or first electrode 301, a lower or second electrode 302 and an upper or third electrode 303. Voltage sources V1, V2, V3 are configured to apply potentials to the first, second and third electrodes respectively. A further voltage source V4 is connected to the sample to apply a fourth potential, which may be ground. Potentials can be defined relative to the sample 208. The first, second and third electrodes are each provided with an aperture through which the respective sub-beam propagates. The second potential can be similar to the potential of the sample, e.g. in the range of from 50 V to 200 V more positive than the sample. Alternatively the second potential can be in the range of from about +500 V to about +1,500 V relative to the sample. A higher potential is useful if the detector module 402 is higher in the optical column than the lowest electrode. The first and/or second potentials can be varied per aperture or group of apertures to effect focus corrections.

Desirably, in some embodiments, the third electrode is omitted. An objective lens having only two electrodes can have lower aberration than an objective lens having more electrodes. A three-electrode objective lens can have greater potential differences between the electrodes and so enable a stronger lens. Additional electrodes (i.e. more than two electrodes) provide additional degrees of freedom for controlling the electron trajectories, e.g. to focus secondary electrons as well as the incident beam.

As mentioned above, it is desirable to use the control lens to determine the landing energy. However, it is possible to use in addition the objective lens 300 to control the landing energy. In such a case, the potential difference over the objective lens is changed when a different landing energy is selected. One example of a situation where it is desirable to partly change the landing energy by changing the potential difference over the objective lens is to prevent the focus of the sub-beams getting too close to the objective lens. This situation can, for example, occur if the landing energy is lowered. This is because the focal length of the objective lens roughly scales with the landing energy chosen. By lowering the potential difference over the objective lens, and thereby lowering the electric field inside the objective lens, the focal length of the objective lens is made larger again, resulting in a focus position further below the objective lens.

In the arrangement depicted, control lens 600 comprises three electrodes 601-603 connected to potential sources V5 to V7. Electrodes 601-603 may be spaced a few millimeters (e.g. 3 mm) apart. The spacing between the control lens and the objective lens (i.e. the gap between lower electrode 602 and the upper electrode of the objective lens) can be selected from a wide range, e.g. from 2 mm to 200 mm or more. A small separation makes alignment easier whereas a larger separation allows a weaker lens to be used, reducing aberrations. Desirably, the potential V5 of the uppermost electrode 603 of the control lens 600 is maintained the same as the potential of the next electron-optic element up-beam of the control lens (e.g. deflectors 235). The potential V7 applied to the lower electrode 602 can be varied to determine the beam energy. The potential V6 applied to the middle electrode 601 can be varied to determine the lens strength of the control lens 600 and hence control the opening angle and demagnification of the beam. Desirably, the lower electrode 602 of the control lens and the uppermost electrode of the objective lens and the sample has substantially the same potential. In one design the upper electrode of the objective lens V3 is omitted. In this case desirably the lower electrode 602 of the control lens and electrode 301 of the objective lens have substantially the same potential. It should be noted that even if the landing energy does not need to be changed, or is changed by other means, the control lens can be used to control the beam opening angle. The position of the focus of a sub-beam is determined by the combination of the actions of the respective control lens and the respective objective lens.

In an example, to obtain landing energies in the range of 1.5 kV to 2.5 kV, potentials V1, V2, V4, V5, V6 and V7 can be set as indicated in Table 1 below. The potentials in this table are given as values of beam energy in keV, which is equivalent to the electrode potential relative to the cathode of the beam source 201. It will be understood that in designing an electron-optical system there is considerable design freedom as to which point in the system is set to a ground potential and the operation of the system is determined by potential differences rather than absolute potentials.

TABLE 1

| Landing Energy | 1.5 keV | 2.5 keV | 3.5 keV |
|---|---|---|---|
| V1 | 29 keV | 30 keV | 31 keV |
| V2 | 1.55 keV | 2.55 keV | 3.55 keV |
| V3 (or omitted) | 29 keV | 30 keV | 31 keV |
| V4 | 1.5 keV | 2.5 keV | 3.5 keV |
| V5 | 30 keV | 30 keV | 30 keV |
| V6 | 19.3 keV | 20.1 keV | 20.9 keV |
| V7 | 29 keV | 30 keV | 31 keV |

It will be seen that the beam energy at V1, V3 and V7 is the same. In embodiments the beam energy at these points may be between 10 keV and 50 keV. If a lower potential is selected, the electrode spacings may be reduced, especially in the objective lens, to limit reduction of the electric fields.

When the control lens, rather than the condenser lens, is used for opening angle/demagnification correction of the electron beam, the collimator remains at the intermediate focus so there is no need for astigmatism correction of the collimator. In addition, the landing energy can be varied over a wide range of energies whilst maintaining an optimum field strength in the objective lens. This minimizes aberrations of the objective lens. The strength of the condenser lens (if used) is also maintained constant, avoiding any introduction of additional aberrations due to the collimator not being at the intermediate focal plane or to changes in the path of the electron through the condenser lens.

In some embodiments, the charged particle assessment tool further comprises one or more aberration correctors that reduce one or more aberrations in the sub-beams. In some embodiments, each of at least a subset of the aberration correctors is positioned in, or directly adjacent to, a respective one of the intermediate foci (e.g. in or adjacent to the intermediate image plane). The sub-beams have the smallest cross-sectional area in or near a focal plane such as the intermediate plane. This provides more space for aberration correctors than is available elsewhere, i.e. upbeam or down-beam of the intermediate plane (or than would be available in alternative arrangements that do not have an intermediate image plane).

In some embodiments, aberration correctors positioned in, or directly adjacent to, the intermediate foci (or intermediate image plane) comprise deflectors to correct for the source 201 appearing to be at different positions for different beams. Correctors can be used to correct macroscopic aberrations resulting from the source that prevent a good alignment between each sub-beam and a corresponding objective lens.

The aberration correctors may correct aberrations that prevent a proper column alignment. Such aberrations may also lead to a misalignment between the sub-beams and the correctors. For this reason, it may be desirable to additionally or alternatively position aberration correctors at or near the condenser lenses of condenser lens array 231 (e.g. with each such aberration corrector being integrated with, or directly adjacent to, one or more of the condenser lenses 231). This is desirable because at or near the condenser lenses of condenser lens array 231 aberrations will not yet have led to a shift of corresponding sub-beams because the condenser lenses are vertically close or coincident with the beam apertures. A challenge with positioning correctors at or near the condenser lenses, however, is that the sub-beams each have relatively large sectional areas and relatively small pitch at this location, relative to locations further downstream. The aberration correctors may be CMOS based individual programmable deflectors as disclosed in EP2702595A1 or an array of multipole deflectors as disclosed EP2715768A2, of which the descriptions of the beamlet manipulators in both documents are hereby incorporated by reference.

In some embodiments, each of at least a subset of the aberration correctors is integrated with, or directly adjacent to, one or more of the objective lenses 234. In some embodiments, these aberration correctors reduce one or more of the following: field curvature; focus error; and astigmatism. Additionally or alternatively, one or more scanning deflectors (not shown) may be integrated with, or directly adjacent to, one or more of the objective lenses 234 for scanning the sub-beams 211, 212, 214 over the sample 208. In some embodiments, the scanning deflectors described in US 2010/0276606, which document is hereby incorporated by reference in its entirety, may be used.

In some embodiments, the objective lens array assembly comprises a detector having a detector module 402 down-beam of at least one electrode of the objective lens array 241. The detector module 402 may take the form of a detector array. In some embodiments, at least a portion of the detector is adjacent to and/or integrated with the objective lens array 241. For example, the detector module 402 may be implemented by integrating a CMOS chip detector into a bottom electrode of the objective lens array 241. Integration of a detector module 402 into the objective lens array replaces a secondary column. The CMOS chip is preferably orientated to face the sample (because of the small distance (e.g. 100 m) between wafer and bottom of the electron-optical system). In some embodiments, electrodes to capture the secondary electron signals are formed in the top metal layer of the CMOS device. The electrodes can be formed in other layers of the substrate, e.g. of the CMOS chip. Power and control signals of the CMOS may be connected to the CMOS by through-silicon vias. For robustness, preferably the bottom electrode consists of two elements: the CMOS chip and a passive Si plate with holes. The plate shields the CMOS from high E-fields.

In order to maximize the detection efficiency it is desirable to make the electrode surface as large as possible, so that substantially all the area of the objective lens array (excepting the apertures) is occupied by electrodes and each electrode has a diameter substantially equal to the array pitch. In some embodiments, the outer shape of the electrode is a circle, but this can be made a square to maximize the detection area. Also the diameter of the through-substrate hole can be minimized. Typical size of the electron beam is in the order of 5 to 15 micron.

In some embodiments, a single electrode surrounds each aperture. In some embodiments, a plurality of electrode elements are provided around each aperture. The electrons captured by the electrode elements surrounding one aperture may be combined into a single signal or used to generate independent signals. The electrode elements may be divided radially (i.e. to form a plurality of concentric annuluses), angularly (i.e. to form a plurality of sector-like pieces), both radially and angularly or in any other convenient manner.

However a larger electrode surface leads to a larger parasitic capacitance, so a lower bandwidth. For this reason it may be desirable to limit the outer diameter of the electrode. Especially in case a larger electrode gives only a slightly larger detection efficiency, but a significantly larger capacitance. A circular (annular) electrode may provide a good compromise between collection efficiency and parasitic capacitance.

A larger outer diameter of the electrode may also lead to a larger crosstalk (sensitivity to the signal of a neighboring hole). This can also be a reason to make the electrode outer diameter smaller. Especially in case a larger electrode gives only a slightly larger detection efficiency, but a significantly larger crosstalk.

The back-scattered and/or secondary electron current collected by electrode is amplified by a Trans Impedance Amplifier.

An example of a detector integrated into an objective lens array is shown in FIG. 6 which illustrates a portion of a multibeam objective lens 401 in schematic cross section. In this example, the detector comprises a detector module 402 comprising a plurality (e.g. an array) of detector elements (e.g. sensor elements such as capture electrodes 405) preferably as an array of detector elements (i.e. a plurality of detector elements in a paten) or arrangement preferably over a two dimensional surface). In this example, the detector module 402 is provided on an output side of the objective lens array. The output side is the output side of the objective lens 401. FIG. 7 is a bottom view of detector module 402 which comprises a substrate 404 on which are provided a plurality of capture electrodes 405 each surrounding a beam aperture 406. The beam apertures 406 may be formed by etching through substrate 404. In the arrangement shown in FIG. 7, the beam apertures 406 are shown in a rectangular array. The beam apertures 406 can also be differently arranged, e.g. in a hexagonal close packed array as depicted in FIG. 8.

FIG. 9 depicts at a larger scale a part of the detector module 402 in cross section. Capture electrodes 405 form the bottommost, i.e. most close to the sample, surface of the detector module 402. Between the capture electrodes 405 and the main body of the silicon substrate 404 a logic layer 407 is provided. Logic layer 407 may include amplifiers, e.g. Trans Impedance Amplifiers, analogue to digital converters, and readout logic. In some embodiments, there is one amplifier and one analogue to digital converter per capture electrode 405. A circuit featuring these elements may be comprised in a unit area referred to as a cell that is associated with an aperture. The detector module 402 may have several cells each associated with an aperture; preferably the cells have similar shape. Logic layer 407 and capture electrodes 405 can be manufactured using a CMOS process with the capture electrodes 405 forming the final metallization layer.

A wiring layer 408 is provided on the backside of, or within, substrate 404 and connected to the logic layer 407 by through-silicon vias 409. The number of through-silicon vias 409 need not be the same as the number of beam apertures 406. In particular if the electrode signals are digitized in the logic layer 407 only a small number of through-silicon vias may be required to provide a data bus. Wiring layer 408 can include control lines, data lines and power lines. It will be noted that in spite of the beam apertures 406 there is ample space for all necessary connections. The detector module 402 can also be fabricated using bipolar or other manufacturing techniques. A printed circuit board and/or other semiconductor chips may be provided on the backside of detector module 402.

The integrated detector module 402 described above is particularly advantageous when used with a tool having tunable landing energy as secondary electron capture can be optimized for a range of landing energies. A detector module in the form of an array can also be integrated into other electrode arrays, not only the lowest electrode array. Further details and alternative arrangements of a detector module integrated into an objective lens can be found in EP Application Number 20184160.8, which document is hereby incorporated by reference.

Figure 10:
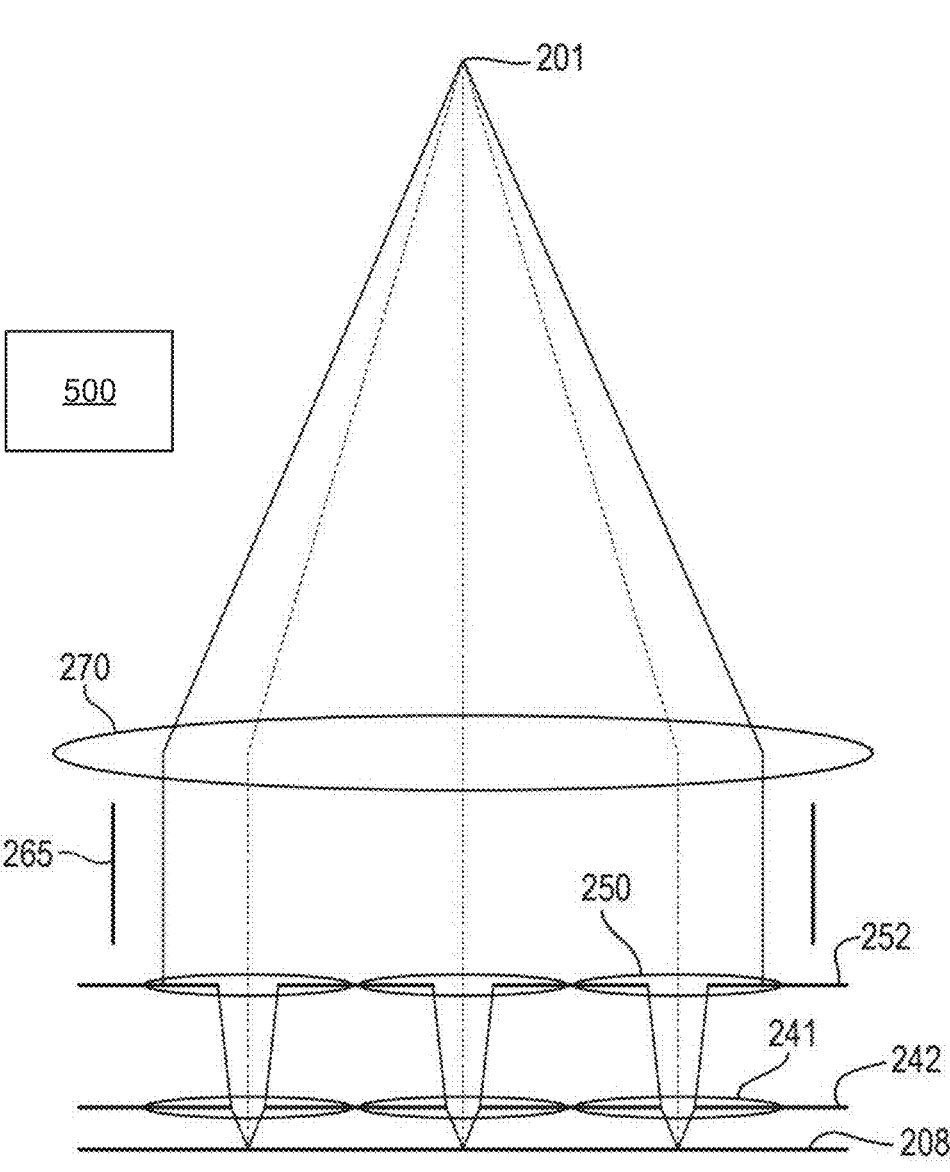
FIG. 10 is a schematic diagram of an exemplary electron-optical column comprising a macro collimator and macro scan deflector.

FIG. 10 is a schematic diagram of a further exemplary electron-optical column for use in an assessment system. The column comprises an objective lens array assembly. The objective lens array assembly comprises an objective lens array 241. The objective lens array 241 comprises a plurality of objective lenses. Each objective lens comprises at least two electrodes (e.g. two or three electrodes) connected to respective potential sources. The objective lens array 241 may comprise two or more (e.g. three) plate electrode arrays connected to respective potential sources. The plate electrode arrays of the objective lens array 241 may be referred to as objective electrodes. Each objective lens formed by the plate electrode arrays may be a micro-lens operating on a different sub-beam or group of sub-beams in the multi-beam. Each plate defines a plurality of apertures (which may also be referred to as holes). The position of each aperture in a plate corresponds to the position of a corresponding aperture (or corresponding hole) in the other plate (or plates). The corresponding apertures define the objective lenses, and each set of corresponding holes therefore operates in use on the same sub-beam or group of sub-beams in the multi-beam. Each objective lens projects a respective sub-beam of the multi-beam onto a sample 208. See also description of objective lens array 234.

In some arrangements, apertures in the objective lens array 241 are adapted to compensate for off-axis aberrations in the multi-beam. For example, the apertures of one or more of the objective electrodes may be shaped, sized and/or positioned to compensation for the off-axis aberrations. The apertures may, for example, have a range of different areas to compensate for field curvature, a range of different ellipticities to compensate for astigmatism, and/or a range of different displacements from nominal grid positions to compensate for distortion caused by telecentricity error. See for example EPA 21166214.3 filed on 31 Mar. 2021 which is hereby incorporated by reference so far as off-axis aberration correction.

The objective lens array assembly further comprises a control lens array 250. The control lens array 250 comprises a plurality of control lenses. Each control lens comprises at least two electrodes (e.g. two or three electrodes) connected to respective potential sources. The control lens array 250 may comprise two or more (e.g. three) plate electrode arrays connected to respective potential sources. The plate electrode arrays of the control lens array 250 may be referred to as control electrodes. The control lens array 250 is associated with the objective lens array 241 (e.g. the two arrays are positioned close to each other and/or mechanically connected to each other and/or controlled together as a unit). The control lens array 250 is positioned up-beam of the objective lens array 241. The control lenses pre-focus the sub-beams (e.g. apply a focusing action to the sub-beams prior to the sub-beams reaching the objective lens array 241). The pre-focusing may reduce divergence of the sub-beams or increase a rate of convergence of the sub-beams. The control lens array and the objective lens array operate together to provide a combined focal length. Combined operation without an intermediate focus may reduce the risk of aberrations.

In some embodiments, an electron-optical system comprising the objective lens array assembly is configured to control the objective lens assembly (e.g. by controlling potentials applied to electrodes of the control lens array 250) so that a focal length of the control lenses is larger than a separation between the control lens array 250 and the objective lens array 241. The control lens array 250 and objective lens array 241 may thus be positioned relatively close together, with a focusing action from the control lens array 250 that is too weak to form an intermediate focus between the control lens array 250 and objective lens array 241. In other embodiments, the objective lens array assembly may be configured to form an intermediate focus between the control lens array 250 and the objective lens array 241.

In some embodiments, the control lens array is an exchangeable module, either on its own or in combination with other elements such as the objective lens array and/or detector module. The exchangeable module may be field replaceable, i.e. the module can be swapped for a new module by a field engineer. Field replaceable is intended to mean that the module may be removed and replaced with the same or different module while maintaining the vacuum in which the electron-optical tool 40 is located. Only a section of the column corresponding to the module is vented for the module to be removed and returned or replaced.

The control lens array may be in the same module as an objective lens array 241, i.e. forming an objective lens array assembly or objective lens arrangement, or it may be in a separate module.

An electric power source may be provided to apply respective potentials to electrodes of the control lenses of the control lens array 250 and the objective lenses of the objective lens array 241.

The provision of a control lens array 250 in addition to an objective lens array 241 provides additional degrees of freedom for controlling properties of the sub-beams. The additional freedom is provided even when the control lens array 250 and objective lens array 241 are provided relatively close together, for example such that no intermediate focus is formed between the control lens array 250 and the objective lens array 241. The control lens array 250 may be used to optimize a beam opening angle with respect to the demagnification of the beam and/or to control the beam energy delivered to the objective lens array 241. The control lens may comprise two or three or more electrodes. If there are two electrodes, then the demagnification and landing energy are controlled together. If there are three or more electrodes the demagnification and landing energy can be controlled independently. The control lenses may thus be configured to adjust the demagnification and/or beam opening angle of respective sub-beams (e.g. using the electric power source to apply suitable respective potentials to the electrodes of the control lenses and the objective lenses). This optimization can be achieved with having an excessively negative impact on the number of objective lenses and without excessively deteriorating aberrations of the objective lenses (e.g. without increasing the strength of the objective lenses).

In the example of FIG. 10, the electron-optical system comprises a source 201. The source 201 provides a beam of charged particles (e.g. electrons). The multi-beam focused on the sample 208 is derived from the beam provided by the source 201. Sub-beams may be derived from the beam, for example, using a beam limiter defining an array of beam-limiting apertures. The source 201 is desirably a high brightness thermal field emitter with a good compromise between brightness and total emission current. In the example shown, a collimator is provided up-beam of the objective lens array assembly. The collimator may comprise a macro collimator 270. The macro collimator 270 acts on the beam from the source 201 before the beam has been split into a multi-beam. The macro collimator 270 bends respective portions of the beam by an amount effective to ensure that a beam axis of each of the sub-beams derived from the beam is incident on the sample 208 substantially normally (i.e. at substantially 90° to the nominal surface of the sample 208). The macro collimator 270 applies a macroscopic collimation to the beam. The macro collimator 270 may thus act on all of the beam rather than comprising an array of collimator elements that are each configured to act on a different individual portion of the beam. The macro collimator 270 may comprise a magnetic lens or magnetic lens arrangement comprising a plurality of magnetic lens sub-units (e.g. a plurality of electromagnets forming a multi-pole arrangement). Alternatively or additionally, the macro-collimator may be at least partially implemented electrostatically. The macro-collimator may comprise an electrostatic lens or electrostatic lens arrangement comprising a plurality of electrostatic lens sub-units. The macro collimator 270 may use a combination of magnetic and electrostatic lenses.

In the example of FIG. 10 a macro scan deflector 265 is provided to cause sub-beams to be scanned over the sample 208. The macro scan deflector 265 deflects respective portions of the beam to cause the sub-beams to be scanned over the sample 208. In some embodiments, the macro scan deflector 256 comprises a macroscopic multi-pole deflector, for example with 8 poles or more. The deflection is such as to cause sub-beams derived from the beam to be scanned across the sample 208 in one direction (e.g. parallel to a single axis, such as an X axis) or in two directions (e.g. relative to two non-parallel axes, such as X and Y axes). In some arrangements, the scanning of the sub-beams is coordinated with movement of the sample 208. For example, a combination of scanning the sub-beams parallel to the X axis while moving the sample 208 parallel to the Y axis may be repeated at different stepped positions of the sample to process multiple parallel elongate strips on the sample 208. A larger movement of the sample 208 may then be used to leap to a new processing location on the sample 208. An example of this movement is described in EPA 21171877.0, filed 3 May 2021, which is hereby incorporated in so far as the control of the beam scanning with stage movement. The macro scan deflector 265 acts macroscopically on all of the beam rather than comprising an array of deflector elements that are each configured to act on a different individual portion of the beam. In the example shown, the macro scan deflector 265 is provided between the macro collimator 270 and the control lens array 250.

Any of the objective lens array assemblies described herein may further comprise a detector (e.g. comprising a detector module 402). The detector detects charged particles emitted from the sample 208. The detected charged particles may include any of the charged particles detected by an SEM, including secondary and/or backscattered electrons emitted from the sample 208. An exemplary construction of a detector module 402 is described above with reference to FIGS. 6 to 9.

In a variation on the example of FIG. 10 the objective lens array assembly may comprise a scan-deflector array. The scan-deflector array comprises a plurality of scan deflectors. Each scan deflector scans a respective sub-beam over the sample 208. The scan-deflector array may thus comprise a scan deflector for each sub-beam. The deflection is such as to cause the sub-beam to be scanned across the sample 208 in the one or two directions (i.e. one dimensionally or two dimensionally). In some embodiments, the scanning deflectors described in EP2425444, which document is hereby incorporated by reference in its entirety specifically in relation to scan deflectors, may be used to implement the scan-deflector array. The scan-deflector array is positioned between the objective lens array 241 and the control lens array 250. The scan-deflector array may be provided instead of the macro scan deflector 265. In other embodiments both the macro scan deflector 265 and the scan-deflector array are provided and may be operated in synchronization. In some embodiments, as exemplified in FIG. 10, the control lens array 250 is the first deflecting or lensing electron-optical array element in the beam path down-beam of the source 201.

A collimator element array may be provided instead of a macro collimator 270. Although not shown, it is also possible to apply this variation to the example of FIG. 3 to provide an example having a macro scan deflector and a collimator element array. Each collimator element collimates a respective sub-beam. The collimator element array may be more spatially compact than a macro collimator 270. Providing the collimator element array and the scan-deflector array 260 together may therefore provide space saving. This space saving is desirable where a plurality of the electron-optical systems comprising the objective lens array assembly are provided in an electron-optical system array. In such an example, there may be no macro condenser lens or a condenser lens array. In this scenario the control lens therefore provides the possibility to optimize the beam opening angle and demagnification for changes in landing energy.

In some embodiments, an electron-optical system array is provided. The array may comprise a plurality of any of the electron-optical systems described herein. Each of the electron-optical systems focuses respective multi-beams simultaneously onto different regions of the same sample. Each electron-optical system may form sub-beams from a beam of charged particles from a different respective source 201. Each respective source 201 may be one source in a plurality of sources 201. At least a subset of the plurality of sources 201 may be provided as a source array. The source array may comprise a plurality of emitters on a common substrate. The focusing of plural multi-beams simultaneously onto different regions of the same sample allows an increased area of the sample 208 to be processed (e.g. assessed) simultaneously. The electron-optical systems in the array may be arranged adjacent to each other so as to project the respective multi-beams onto adjacent regions of the sample 208. Any number of electron-optical systems may be used in the array. Preferably, the number of electron-optical systems is in the range of from 9 to 200. In some embodiments, the electron-optical systems are arranged in a rectangular array or in a hexagonal array. In other embodiments, the electron-optical systems are provided in an irregular array or in a regular array having a geometry other than rectangular or hexagonal. Each electron-optical system in the array may be configured in any of the ways described herein when referring to a single electron-optical system. As mentioned above, the scan-deflector array 260 and collimator element array 271 are particularly well suited to incorporation into an electron-optical system array because of their spatial compactness, which facilitates positioning of the electron-optical systems close to each other.

Figure 11:
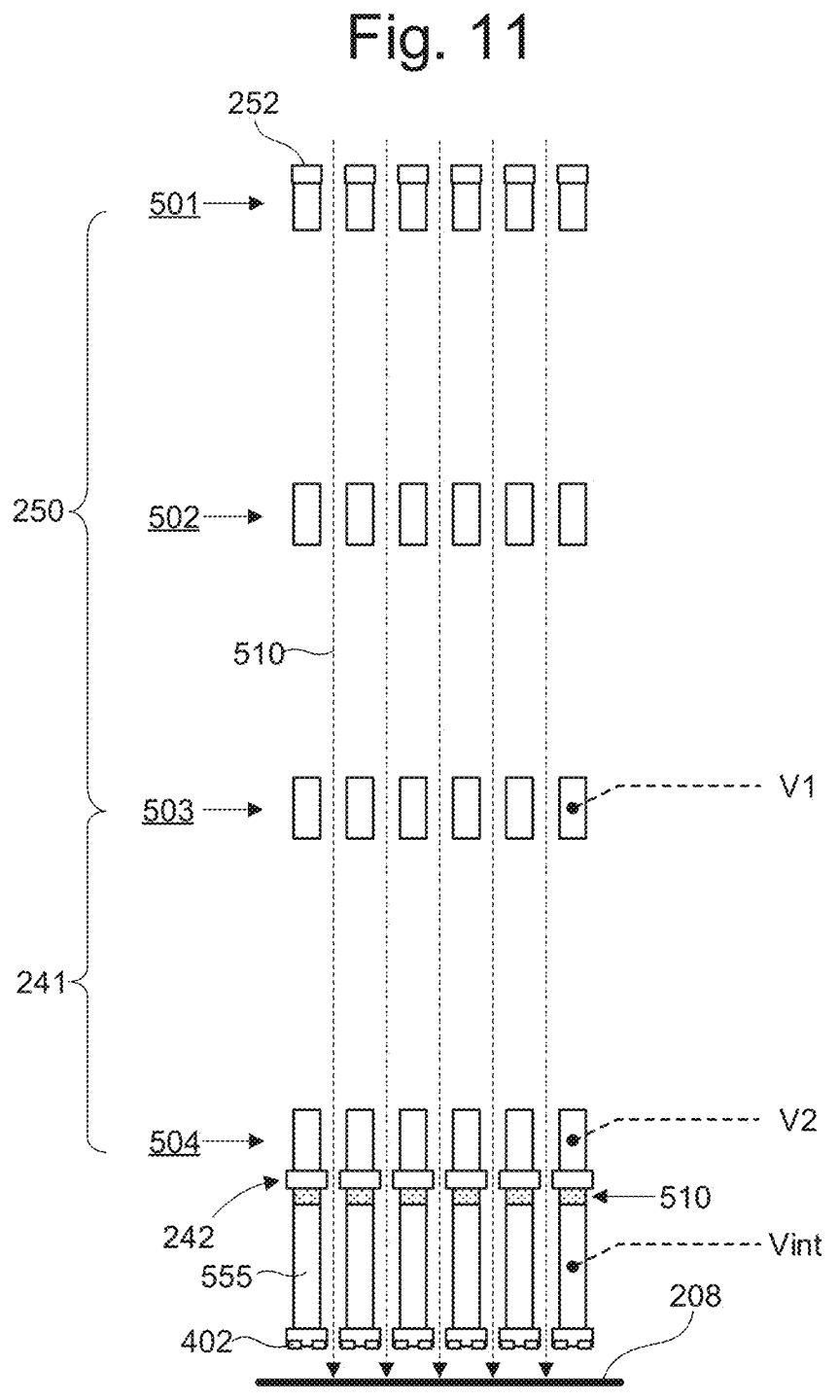

FIG. 11 depicts a portion of a further example of an objective lens array assembly. This objective lens array assembly could be used in the arrangement of FIG. 10. The objective lens array assembly comprises a control lens array 250 and an objective lens array 241. As depicted in FIG. 11, the control lens array 250 may be defined by a plurality of control electrodes 501-503. Each control electrode 501-503 may comprise a plate-like element with an aperture for each sub-beam path 510 (forming an array of apertures). The objective lens array 241 may be defined by a plurality of objective electrodes 503-504. Each objective electrode 503-504 may comprise a plate-like element with an aperture for each sub-beam path 510 (forming an array of apertures). The control electrodes 501-503 and the objective electrodes 503-504 may be referred to as lens electrodes. The combination of the control lens array 250 and objective lens array 241 may comprise at least four such lens electrodes. The lens electrodes may be arranged orthogonal to and/or in series along sub-beam paths 510 of the multi-beam.

Five exemplary sub-beam paths 510 are shown in FIG. 11. The control electrodes 501-503 are arranged in series along the sub-beam paths 510 and define respective apertures aligned with the sub-beam paths 510 to define the control lenses. Each control lens is thus aligned with a sub-beam path 510 of a respective sub-beam and operates on (e.g. electrostatically manipulates) the sub-beam. Each control electrode 501-503 may operate on a portion of the sub-beams or on all of the sub-beams. Each objective lens in the objective lens array 241 may be aligned with a sub-beam path 510 aligned with a respective control lens. The objective lens array 241 directs the sub-beams onto the sample 208.

The arrangement may be described as four or more lens electrodes that are plates. In the plates are defined apertures, for example as aperture arrays, that are aligned with a number of beams in a corresponding beam array. The electrodes may be grouped into two or more electrodes, for example to provide a control electrode group, and an objective electrode group. In an arrangement the objective electrode group has at least three electrodes and the control electrode group has at least two electrodes.

In the example of FIG. 11, the objective electrode 503 furthest from the sample 208 (which may be referred to as the up beam most electrode of the objective lens array 641)

and the control electrode 503 closest to the sample 208 (which may be referred to as the down beam most electrode of the control lens array 250) are provided by a common electrode. Thus, the up beam most electrode of the objective electrode group is the common electrode being also a member of the control electrode group. The surface of the common electrode 503 facing away from the sample 208 (which may be described as an up beam surface) contributes functionality to the control lens array and may therefore be considered as comprising part of the control lens array. The surface of the common electrode 503 facing towards the sample 208 (which may be referred to as a down beam surface) contributes functionality to the objective lens array 241 and may therefore be considered as comprising part of the objective lens array 241.

The provision of a common electrode is beneficial where it is desirable for the control lens array 250 to be positioned close to the objective lens array 241. This is more likely to be the case in arrangements where an array of scan deflectors 260 is not used, for example where a macro scan deflector 265 is used instead. This is because where an array of scan deflectors 260 is used it is desirable to position the array of scan deflectors 260 between the control lens array 250 and the objective lens array 241, for example to make a distance between the scanning deflector 260 and the objective lens array 241 as short as possible. An arrangement with a macro scan deflector 265 is exemplified in FIG. 10. It is noted, however, that variations on the arrangement of FIG. 10 are possible that still do not have a condenser lens array but do have an array of scan deflectors. In such arrangements it may also be desirable to position the array of scan deflectors between a control lens array and an objective lens array. Alternatively, the array of scan deflectors could be positioned elsewhere, such as within the control lens array or upbeam of the control lens array, such as between the control lens array and an array of beam-limiting apertures.

In this example of FIG. 11, the objective lens array assembly further comprises a beam shaping limiter 242. The beam shaping limiter 242 defines an array of beam-limiting apertures. The beam shaping limiter 242 may be referred to as a beam shaping-limiting aperture array or final beam-limiting aperture array. The beam shaping limiter 242 may comprise a plate (which may be a plate-like body) having a plurality of apertures. The beam shaping limiter 242 is down-beam from at least one electrode (optionally from all electrodes) of the control lens array 250. In some embodiments, the beam shaping limiter 242 is down-beam from at least one electrode (optionally from all electrodes) of the objective lens array 241. In some embodiments, it can be an array, for example a bottom most array of the objective lens array 241.

In an arrangement, the beam shaping limiter 242 is structurally integrated with an electrode of the objective lens array 241. Each beam-limiting aperture has a beam limiting effect, allowing only a selected portion of the sub-beam incident onto the beam shaping limiter 242 to pass through the beam-limiting aperture 124. The selected portion may be such that only a portion of the respective sub-beam passing through a central portion of respective apertures in the objective lens array reaches the sample 208.

In some embodiments, the electron-optical system further comprises an upper beam limiter 252. The upper beam limiter 252 defines an array of beam-limiting apertures or generates the array of beams for example from a source beam from source 201. The upper beam limiter 252 may comprise a plate (which may be a plate-like body) having a plurality of apertures. The upper beam limiter 252 forms sub-beams from a beam of charged particles emitted by the source 201. Portions of the beam other than those contributing to forming the sub-beams may be blocked (e.g. absorbed) by the upper beam limiter 252 so as not to interfere with the sub-beams down-beam.

The upper beam limiter 252 may form part of the objective lens array assembly. The upper beam limiter 252 may, for example, be adjacent to and/or integrated with the control lens array 250 (e.g. adjacent to and/or integrated with, or even as, an electrode of the control lens array 250 nearest to the source 201). In some embodiments, the upper beam limiter 252 defines beam-limiting apertures that are larger (e.g. have larger cross-sectional area) than beam-limiting apertures of the beam shaping limiter 242. The beam-limiting apertures of the beam shaping limiter 242 may thus be of smaller dimension than the corresponding apertures defined in the objective lens array 241 and/or in the control lens array 250.

The beam shaping limiter 242 is desirably configured to have a beam-limiting effect (i.e. to remove a portion of each sub-beam that is incident on the beam shaping limiter 242). The beam shaping limiter 242 may, for example, be configured to ensure that each sub-beam exiting an objective lens of the objective lens array 241 has passed through the center of the respective objective lens. Further the beam shaping limiter 242 reduces the length over which the scanning operates on the sub-beams. The distance is reduced to the length of the beam path from the beam shaping limiter 242 to the sample surface.

The beam shaping limiter 242 may be formed integrally with a bottom electrode of an objective lens array 241. It is generally desirable to position the beam shaping limiter 242 adjacent to the electrode of each objective lens that has the strongest lensing effect. In an arrangement it is desirable to provide the beam shaping limiter 242 up-beam of a detector module 402 of a detector. Providing the beam shaping limiter 242 up-beam of the detector module 402 ensures that the beam shaping limiter 242 will not obstruct charged particles emitted from the sample 208 and prevent them from reaching the detector module 402. The beam shaping limiter 242 may thus be provided directly adjacent to the detector module 402 in the up-beam direction.

As exemplified above with reference to FIG. 1-11, an assessment system may be provided that directs charged particles in sub-beams arranged in a multi-beam towards a sample. The assessment system may be referred to as a multi-beam charged particle assessment system. The assessment system comprises an objective lens array 241. The objective lens array 241 may take any of the forms described with reference to FIGS. 3 and 5-11. In some arrangements, the assessment system further comprises a control lens array 250. Where present, the control lens array 250 may take any of the forms described with reference to FIGS. 3, 5, 10 and 11. The assessment system detects signal electrons emitted from the sample 208 (e.g. using a detector, which may comprise a detector module 402 as described above) to obtain information about the sample 208.

As described above, the objective lens array 241 comprises electrodes (which may be referred to as objective electrodes). The electrodes may comprise conductive plates in series along sub-beam paths. Each conductive plate defines apertures aligned with the sub-beam paths. In FIGS. 5 and 11, electrodes 301-302 and 503-504 are examples of such conductive plates. The assessment system applies potentials to the electrodes to control the sub-beams of the multi-beam (e.g. to demagnify the sub-beams and/or focus the sub-beams correctly on a sample to be assessed).

The assessment system may comprise a controller 500 (as depicted schematically in FIGS. 3 and 10) to control operation of the electrodes. As described below, the controller 500 may be computer-implemented, with any suitable combination of elements (e.g. CPUs, RAM, etc.) being used to provide the required functionality. As described above with reference to FIG. 5, the control electrodes and objective electrodes may be controlled by connecting the electrodes to potential sources. The controller 500 may thus comprise and/or control potential sources. The potential sources may apply potentials to the different electrodes, the sample 208, and/or other elements (such as an intermediate element 555 as described below). The controller 500 may further control a stage for supporting the sample.

Any reference herein to the assessment system (or simply system) being configured to perform functionality is intended to encompass the case where the controller 500 is configured to perform the functionality (e.g. by being suitably programmed to provide the necessary control signals to apparatus such as the potential sources and/or stage).

In operation, the assessment system generates strong electric fields between electrodes of the objective lens array 241. Significant electric fields may also be generated between electrodes elsewhere in the system. Strong electric fields are associated with correspondingly strong electrostatic pressures. Electrostatic pressure is proportional to the field energy density, $\eta_E$, which in turn is proportional to $E^2$ according to $\eta_E = \frac{1}{2}\varepsilon E^2$ (where $\varepsilon$ is the electric permittivity and E is the electric field strength). The electrostatic pressure thus increases quickly with increasing E.

In some arrangements, the electrostatic pressure causes a change in shape and/or position of one or more electrodes of the assessment system. The change in shape and/or position of electrodes may be referred to as electrode distortion. FIG. 12 depicts such electrode distortion schematically for electrodes 503 and 504 of an objective lens array 241. For ease of depiction, the electrodes 503, 504 are shown without apertures and not to scale. Broken lines, that are shaped as rectangles, depict an example cross-sectional shape of the electrodes 503, 504 before the system is turned on (i.e. when no electric field is present between the electrodes 503, 504). In this example, the electrodes 503, 504 are substantially planar at this stage. The solid line rectangles depict example cross-sectional shapes of the electrodes 503, 504 when the system is turned on and an example electric field is present between the electrodes. FIG. 12 depicts a typical case where electrodes bow into a region of high electric field strength. This mode of electrode distortion may be referred to as bow. Bow may cause distortion having a parabolic or approximately parabolic form. That is the distortion varies as an approximate function of the square of radial position.

Electrode distortion in the objective lens array 241 may affect sub-beams of the multi-beam. The electrode distortion may contribute to field curvature for example. Field curvature is where the focus plane is different for different sub-beams of the multi-beam, which may lead to focus errors at a planar surface of the sample 208. It is possible to configure the objective lens array to compensate for a predicted effect on the sub-beams from a predicted electrode distortion in the objective lens array. The objective lens array may thus be provided with a hardware correction. In some arrangements, the hardware correction comprises variations in sizes (e.g., diameters where the apertures are circular) of apertures defined in one or more of the electrodes as a function of position in each electrode. Varying the sizes of apertures in the electrodes can compensate for changes in field curvature.

Finite manufacturing tolerances limit the accuracy of electrode distortion prediction. Finite manufacturing tolerances lead to small but significant variations between different manufactured instances of the objective lens array 241, such as differences in electrode thicknesses and/or aperture sizes. These variations can affect the stiffness of the electrodes, which may result in a given electrostatic pressure being associated with different electrode distortions for different manufactured instances. This variability means that hardware corrections of the type described above may not achieve optimal compensation. For typical implementations of the type shown in FIG. 3, it is expected that electrode distortion could lead to surface displacements of up to around 10 microns. If a budget defocus amount of 100 nm is allocated to this effect, this would imply that electrode distortion should be reproducible to within 1% if a hardware correction (e.g. by varying aperture diameters) is to be effective. It is undesirable to be constrained to such tight manufacturing tolerances. For arrangements of the type shown in FIG. 10, the electrode distortion is expected to be much smaller, but it is particularly desirable in such systems to support tunable landing energy Tuning landing energy leads to significant changes in the electrostatic field in the objective lens array, which may again lead to hardware corrections being inadequate. Arrangements described below aim to improve compensation of an effect of electrode distortion. The improved compensation may allow manufacturing tolerances to be relaxed (e.g. from 1% to 10%) and/or to support tunable landing energy functionality.

In one class of arrangement, a method of compensating for an effect of electrode distortion in electrodes of the objective lens array 241 is provided. The effect of the electrode distortion comprises an effect on sub-beams of the multi-beam, such as a change in field curvature. The method comprises adjusting the electrode distortion. The adjustment reduces an effect on the sub-beams from electrode distortion. In a case where electrode distortion causes field curvature in the multi-beam, the adjustment of the electrode distortion may thus reduce the field curvature. In some arrangements, the adjustment of the electrode distortion comprises adjusting the electrode distortion to substantially match a predicted electrode distortion. Such matching of a predicted electrode distortion may compensate for the actual electrode distortion. This matching of the predicted electrode distortion may mean that a hardware correction for compensating a predicted effect on the sub-beams from the predicted electrode distortion becomes more effective. For example, a hardware correction for field curvature may become more effective, thereby lowering field curvature. In an arrangement the predicted distortion is a target distortion which may on application to the objective lens array match an actual distortion or alternatively adjust the electrodes of the objective lens array 241 so that they act on the sub-beams to provide a desired electron-optical effect, for example to apply a desired field curvature between the sub-beams.

The electrode distortion is adjusted by varying an electrostatic field in the objective lens array 241. The variation of the electrostatic field may comprise changing an electric field strength in a volume between two electrodes in order to change the electrostatic field pressure acting between those electrodes. An increase in the electric field strength will increase an amount of distortion of the electrodes. A decrease in the electric field strength will decrease an amount of distortion of the electrodes.

As mentioned above, the electrodes 503, 504 of the objective lens array 241 may comprise conductive plates in series along sub-beam paths. In each plate are defined apertures that are aligned with the sub-beam paths. An aperture in such a conductive plate will have a lensing effect where an electric field is present on one side of the aperture and a sub-beam passes through the aperture. Each aperture operating in this way may be referred to as an elementary lens or aperture lens. The focal length, f, of such an elementary lens depends on the energy of the sub-beam, U, and the electric field strength, E, according to $f=4$ U/E. In arrangements where the objective lens array 241 has two electrodes only, as exemplified in FIGS. 11 and 12 for example, each objective lens will comprise two elementary lenses. The first elementary lens will be defined by an aperture in the electrode 503 furthest from the sample 208. The second elementary lens will be defined by an aperture in the electrode 504 closest to the sample. The beam energy at each electrode is defined by the potential applied to the electrode.

If the objective lens is a decelerating lens, the first elementary lens will be a negative lens and the second elementary lens will be a positive lens. The second elementary lens will be stronger (i.e. a smaller focal length, f) than the first elementary lens because the beam energy U of the sub-beam is lower when the sub-beam reaches the second elementary lens (i.e. after deceleration).

Conversely, if the objective lens is an accelerating lens, the first elementary lens will be a positive lens and the second elementary lens will be a negative lens. The first elementary lens will be stronger (i.e. a smaller focal length f) than the second elementary lens in this case because the beam energy U of the sub-beam is higher when the sub-beam reaches the second elementary lens (i.e. after acceleration).

In arrangements of the present disclosure, each objective lens is typically operated as a decelerating lens with a large difference in beam energy between the first and second elementary lenses. This means that the second elementary lens in each objective lens is much stronger than the first elementary lens and largely dominates the properties of the objective lens. For example, in one implementation the beam energy at electrode 503 is 30 keV and the beam energy at electrode 504 is 2.5 keV, making the first elementary lens 12 times weaker than the second elementary lens. An example of a second elementary lens and associated equipotentials providing the lensing effect are depicted schematically in FIG. 13. The arrows schematically represent the direction of forces (perpendicular to the equipotentials) that would be applied to charged particles passing through the elementary lens.

As described above, varying the electrostatic field between electrodes varies the electrostatic pressure. The variation in the electrostatic pressure provides the desired adjustment of the electrode distortion. The method further comprises refocusing a sub-beam (optionally all of the sub-beams) of the multi-beam in response to this variation in electrostatic field. The refocusing avoids sub-beams becoming undesirably defocused at the sample 208.

As will be exemplified below with reference to FIG. 14-17 particularly, the adjusting of the electrode distortion and the refocusing are performed by changing potentials V1, V2 applied to at least two electrodes of the objective lens array 241. (The potential V1 may be referred to as an up-beam electrode potential. The potential V2 may be referred to as a down beam electrode potential). The two electrodes are exemplified by electrodes labelled 503 and 504. These electrodes may correspond to the electrodes labelled 503 and 504 in FIG. 11 and/or to the electrodes labelled 301 and 302 in FIG. 5. A potential Vs at the sample 208, which may be referred to as the sample potential, defines the landing energy of the sub-beams. Combined with control of the potential Vs at the sample 208 the control of the potentials V1 and V2 provides three degrees of freedom for the system consisting of the two electrodes and the sample 208. The three degrees of freedom can be represented by the three potentials V1, V2 and Vs.

Adjustment of the electrode distortion involves control of an electric field E1 (or lens field strength) in the objective lens array 241. In the examples of FIG. 14-17, the electric field E1 is the field between electrodes 503 and 504. It is further desirable to control the landing energy (defined by Vs) of a sub-beam, an overall focal length f of the objective lens acting on the sub-beam (or sub-beam focal length, f), and the field strength E2 at the sample 208 (or a sample field strength E2). The three degrees of freedom V1, V2 and Vs are not sufficient to control all of E1, Vs, f and E2 independently. As described below with reference to FIGS. 15 and 16, control of V1, V2 and Vs can be used to control a selected three of E1, Vs, f and E2. If an additional degree of freedom is provided, as discussed below with reference to FIGS. 14 and 17, it is possible to control all of E1, Vs, f and E2 independently.

Figure 15:
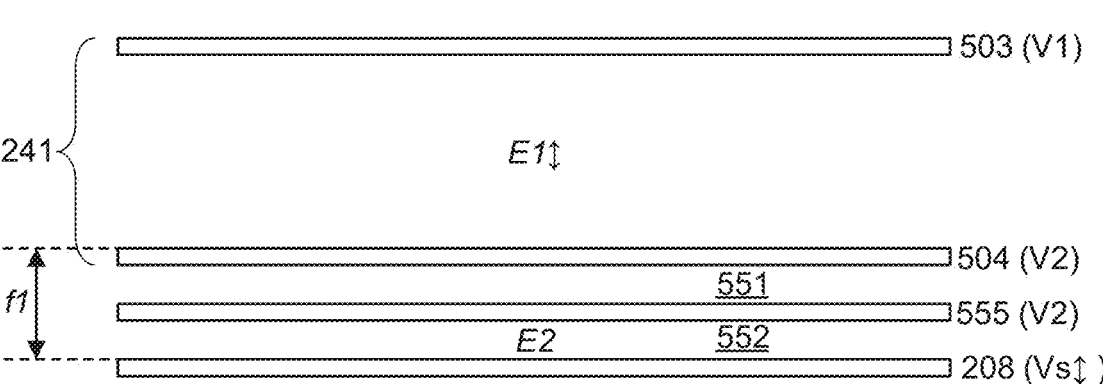
FIG. 15 is a schematic side sectional view of portions of electrodes in an objective lens array above a sample where a beam energy at a lowest electrode of the objective lens array is adjusted to refocus a sub-beam, the electric field above the sample is kept constant, and the landing energy is allowed to vary.
Figure 16:
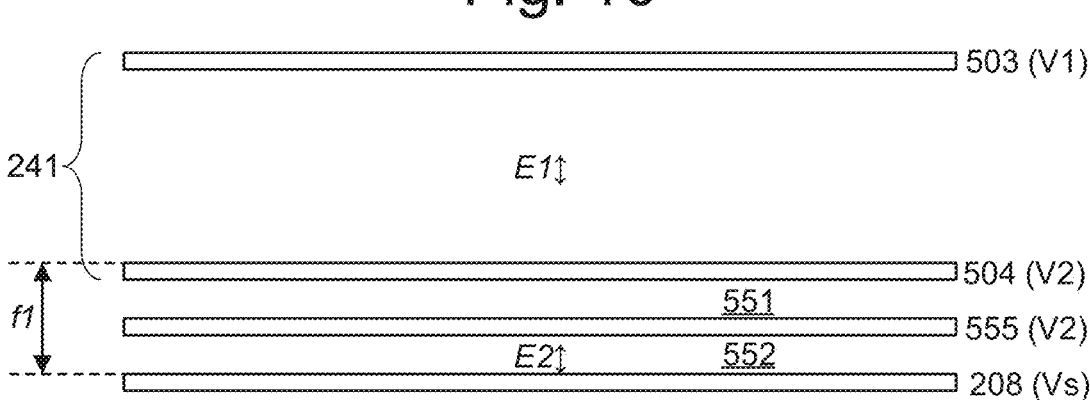
FIG. 16 is a schematic side sectional view of portions of electrodes in an objective lens array above a sample where a beam energy at a lowest electrode of the objective lens array is adjusted to refocus a sub-beam, the landing energy is kept constant, and the electric field above the sample is allowed to vary.

In the examples of FIGS. 11 and 14-17, the assessment system also comprises an intermediate element 555. The intermediate element 555 is between the sample 208 and the objective lens array 241 (i.e. between the sample 208 and an electrode 504 of the objective lens array 241 closest to the sample 208). The intermediate element 555 comprises or supports a detector for detecting signal electrons emitted from the sample 208. In the example of FIG. 11, the intermediate element 555 supports a detector comprising a detector module 402 as described above with reference to FIG. 6-9. In FIG. 14-16 the intermediate element 555 is electrically connected to the electrode 504. The potential of the intermediate element 555 is not therefore controllable independently of the potential V2 of the electrode 504 in these examples (the potential of both elements is V2). As will be explained below with reference to FIGS. 11 and 17, in some arrangements the intermediate element 555 is configured to allow a potential Vint of the intermediate element 555 to be controlled independently. The potential Vint may be referred to as the intermediate element potential.

In some arrangements, as exemplified in FIG. 14, the refocusing comprises varying (i.e. controlling) a distance between the sample 208 and the objective lens array 241 (and the intermediate element 555 in this example). The distance may be varied for example by moving the sample 208 towards or away from the objective lens array 241. This movement may be described as movement along a Z axis (or Z displacement). The movement may be performed at least partially by moving a stage supporting the sample 208. The stage may be moved towards or away from the objective lens array 241. In the example of FIG. 14, the adjustment of electrode distortion involves decreasing the electric field E1 between electrodes 503 and 504 by appropriate control of potentials V1 and V2 (e.g. according to E1=|V1−V2|/d, for a parallel plate geometry with a separation d between the electrodes. That is the lens field strength is the same as the ratio between the modulus of the difference between the up-beam electrode potential and down-beam electrode potential on one hand and the separation between the electrodes on the other). The decrease in E1 decreases electrode distortion. The decrease in E1 also involves a reduction in the beam energy at electrode 504 (defined by V2). As explained above, for a decelerating objective lens array 241 comprising two electrodes only, the elementary lenses associated with the electrode 504 closest to the sample 208 will be the dominant elementary lenses. The overall focal length of the objective lens thus increases, as indicated schematically by the change from f1 (a first focal length) to f2 (a second focal length) in FIG. 14. In this example, the movement of the sample 208 in response to the variation in electrostatic field would therefore be such as to move the sample 208 further from the objective lens array 241 and intermediate element 555 (e.g., by a distance equal to the difference between f1 and f2).

Refocusing the sub-beams by moving the sample 208 is relatively easy to implement. The additional degree of freedom provided by this functionality also makes it possible for the electric field E2 and the landing energy (given by Vs) to both be kept constant during the adjustment of the electrode distortion and the refocusing. In this example, the requirement to keep Vs and E2 constant effectively determines V2. (Note: V2 will need to increase to compensate for the increased separation between electrode 504, or the intermediate element 555 if present, and the sample 208). V1 then follows from the value of E1 required to achieve the desired adjustment of electrode distortion. The change in V1 may also lead to changes in the settings of a control lens array 250 where this is present.

In an example implementation, a 1% change in the electric field E1 between electrodes 503 and 504 will give a 1% change in the focal length f of an objective lens according to f=4 U/E for the dominant elementary lens. For a typical focal length f of 0.5 mm, the resulting focus shift would be 5 micron. This is smaller than a typical clearance above the sample 208 (e.g., between the sample 208 and an intermediate element 555 comprising a detector), which may be of the order of 50 microns.

Figure 17:
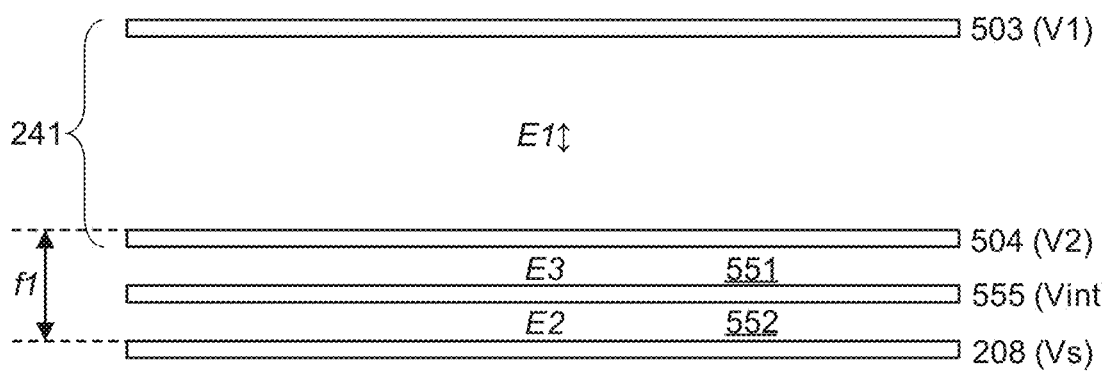
FIG. 17 is a schematic side sectional view of portions of electrodes in an objective lens array above a sample where a beam energy at a lowest electrode of the objective lens array is adjusted to refocus a sub-beam, and a potential of an intermediate element is adjusted to keep the landing energy and electric field at the sample constant.

FIG. 15-17 depict arrangements in which the sample 208 is not moved relative to the objective lens array 241. As a consequence, the arrangements of FIGS. 15 and 16 have one less degree of freedom and only three of the parameters E1, Vs, f and E2 can therefore be controlled independently.

In the example of FIG. 15, the electric field E2 at the sample 208 is controlled to be kept constant during the adjustment of the electrode distortion and the refocusing, while the landing energy at the sample 208 (defined by Vs) is allowed to vary (i.e., is not controlled to be constant). Keeping the electric field E2 constant may be desirable for an operator because it will avoid negative impact on SEM image contrast formation. If the electrostatic field E1 is increased by 10% and V2 is increased by 10% to keep f constant, it will be necessary to increase the landing energy (Vs) by about 10% of V2. If the landing energy is 2.5 keV, for example, this would result in an approximate 250 eV change in landing energy. If the landing energy is 1 keV, the absolute change in landing energy will be smaller, typically about 100 eV.

In the example of FIG. 16, the potential Vs is controlled to maintain a constant landing energy during the adjustment of the electrode distortion and the refocusing, and the electric field E2 at the sample 208 is allowed to vary (i.e., is not controlled to be constant). This approach avoids unwanted changes in landing energy but involves a variation in the electric field E2 at the sample 208. In an example implementation, in case of a 5% change in electric field E1 between electrodes 503 and 504 and a resulting 125 eV change in beam energy at electrode 504 (in the case of 2.5 keV landing energy), the potential difference between the sample 208 and an element of the column at the potential of electrode 504 that is closest to the sample (e.g. an intermediate element 555 (if present) and/or detector electrically connected to the electrode 504) would change from 50V (the nominal offset voltage) to 175V. 175V would lead to an electric field E2 of 3.5 kV/mm on the sample 208 (E2=175V/0.05 mm). This field strength is high and may be close to what would be practically acceptable. At lower landing energies, the range of correction would be larger. For example, for a 1 keV landing energy in the above arrangement, the change in potential difference between the detector and the sample 208 would be from 50V to 150V for a 10% change in electric field E1 between electrodes 503 and 504.

As mentioned above, the adjusting and the refocusing comprises changing potentials applied to two electrodes in the objective lens array 241. In some arrangements, one of the two electrodes is an electrode of the objective lens of the objective lens array 241 that applies the strongest lensing effect to the sub-beam compared to other electrodes of the objective lens. This approach is particularly effective for achieving refocus because the electrode that applies the strongest lensing effect will have the largest influence on the overall focusing action of the objective lens. In the examples shown, the electrode applying the strongest lensing effect is the electrode 504 (or down-beam electrode) of the objective lens array 241 closest to the sample 208. Such an arrangement is often a decelerating objective lens. Typically in an accelerating objective lens, the electrode 503 (or up-beam electrode) of the objective lens 241 furthest from the sample is the electrode applying the strongest lensing effect.

In arrangements where the objective lens array comprises more than two electrodes in series along each sub-beam path, the electrode closest to the sample 208 may not be the electrode that provides the strongest lensing effect. For example, in an Einzel lens configuration with three electrodes in series along each sub-beam path, the middle electrode may apply the strongest lensing effect (because the beam energy is lowest at the middle electrode). Other arrangements having more than two electrodes may be used, including arrangements in which three or more electrodes are arranged asymmetrically along the sub-beam paths (with non-uniform spacings between different pairs of adjacent electrodes). Using more than two electrodes will provide more degrees of freedom for controlling sub-beams in the multi-beam. Any electrode of the objective lens array that is provided between regions of different field strength will be subject to forces from electrostatic pressure that may cause distortion of the electrode. In arrangements having three of more electrodes, two or more distinct volumes may be defined between respective pairs of adjacent electrodes. Distortion of electrodes on either side of such volumes may lead to changes in the shape of these volumes, as shown schematically for an example volume in FIG. 12. The changes in shape of a volume may be described as a distortion between electrodes on either side of the volume, which may be described as a variance, or perturbation away from, their relative unperturbed states. A change in shape of a volume will lead to a corresponding variation in electric field in the volume as a function of position in the volume. The electric field will be stronger, for example, in regions where the electrodes are closer together (e.g. in the central region in FIG. 12) compared to regions where the electrodes are further apart (e.g. in peripheral regions in the example of FIG. 12). The variation in electric field as a function of position in a volume may contribute to field curvature by causing a corresponding variation in the strength of elementary lenses that depend on the electric field in the volume. A distortion of an electrode that changes the position along sub-beam paths of apertures defining elementary lenses will also contribute to field curvature. Different electrodes may distort in different ways, leading to a wide range of potential variations in shapes of electrodes and volumes between electrodes. There may therefore be many contributions to overall electrode distortion in the objective lens array. Controlling a potential applied to any electrode subject to distortion from electrostatic pressure can modify the shape of that electrode and thereby contribute to adjusting overall electrode distortion in the objective lens array and effects of electrode distortion (such as field curvature). The electrode closest to the sample 208 may be distorted in this way, so changing a potential applied to the electrode closest to the sample 208 may be used to adjust electrode distortion.

Thus, in summary, one of the two electrodes whose potentials are changed to perform the adjusting and the refocusing mentioned above may be an electrode of the objective lens of the objective lens array 241 that acts on the sub-beam and is closest to the sample 208 compared to other electrodes of the objective lens. As described above, this may be done because the electrode closest to the sample provides the strongest elementary lens or because it is necessary to adjust the beam energy at this electrode to provide the desired adjustment of electrode distortion in the objective lens array.

In some arrangements, as exemplified in FIG. 17, a further degree of freedom is provided. The further degree of freedom is achieved by changing a potential applied to an intermediate element 555 to create an electric field E3 (or intermediate field) between the intermediate element 555 and the objective lens array 241. (Therefore the electric field E3 is between the intermediate element 555 and each objective lens acting on a sub-beam or the down beam electrode 504). As exemplified in FIGS. 11 and 14-17, the intermediate element 555 is provided between the sample 208 and the objective lens array 241 (and therefore between the sample 208 and each objective lens acting on a sub-beam). As in the example of FIG. 14, the extra degree of freedom makes it possible for the electric field E2 and the landing energy (given by Vs) to both be kept constant during the adjustment of the electrode distortion and the refocusing. This is effectively achieved by introducing the possibility of varying an electric field differently in a first volume 551 and a second volume 552. The first volume 551 extends from the objective lens array 241 towards the second volume 552; that is between down-beam electrode 504 and the intermediate element 555. The second volume covers the sample 208; that is the second volume 552 is between the intermediate element 555 and the sample 208. The electric field E3 in the first volume 551 can be varied to compensate for changes in the potential applied to electrode 504 (e.g. to maintain a constant landing energy at the sample 208) while still keeping the electric field E2 constant in the second volume 552 and therefore constant at the sample 208. In an example implementation, a 10% change in electric field E1 between electrodes 503 and 504 results in a 250 eV change in the beam energy at electrode 504 (in the case of 2.5 keV landing energy). This would result in a 250V potential difference between the electrode 504 and the intermediate element 555. For a typical distance of 50 microns between the electrode 504 and the intermediate element 555, this would lead to an electric field E3 between these elements of 5 kV/mm, which is acceptable.

To allow independent control of a potential of the intermediate element 555, the intermediate element 555 should be electrically isolated from the objective lens array 241 and the stage. Thus, the intermediate element 555 may be positioned between the objective lens array 241 and the stage and electrically isolated from both. In the example of FIG. 11, the intermediate element 555 is mechanically attached to the electrode 504 of the objective lens array 241 closest to the sample 208 by an electrically insulating connection member 510.

Figure 18:
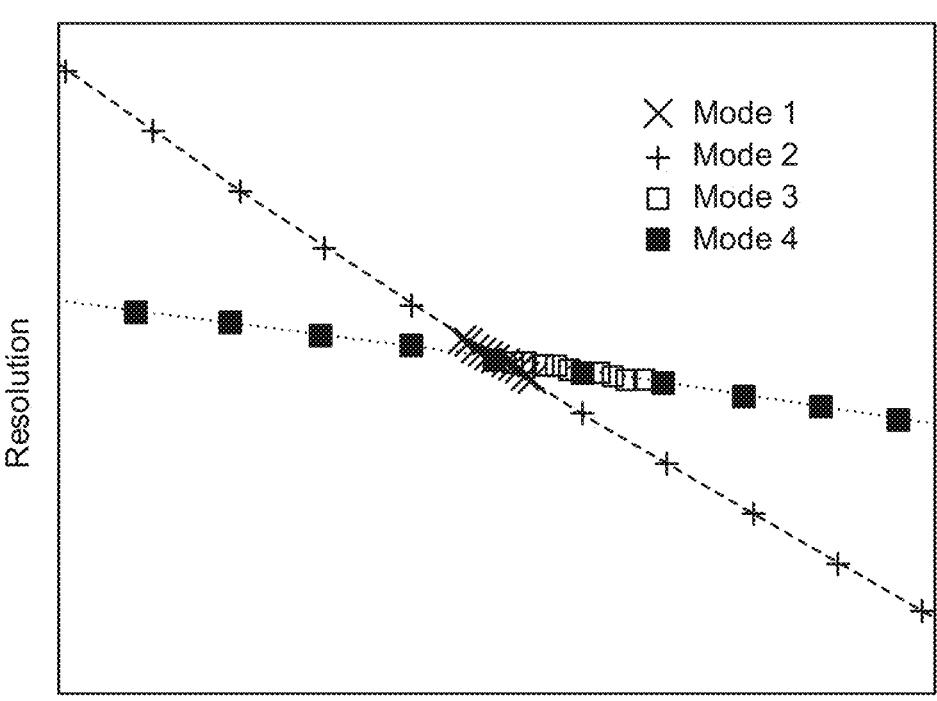
FIG. 18 is a graph showing a predicted impact on resolution for different methods of compensating for electrode distortion.

FIG. 18 is a graph showing a predicted impact on resolution for the different methods of compensating for an effect of electrode distortion. The graphs were derived by analytical ray tracing of sub-beams through an objective lens array. The vertical axis shows variation in resolution. The horizontal axis shows variation in electric field strength in the objective lens array. Mode 1 corresponds to the case where the adjusting and refocusing is performed at constant E2 and Vs by allowing movement of the sample (as described above with reference to FIG. 14). Mode 2 corresponds to the case where the adjusting and refocusing is performed at constant E2 and varying Vs (as described above with reference to FIG. 15). Mode 3 corresponds to the case where the adjusting and refocusing is performed at constant Vs and varying E2 (as described above with reference to FIG. 16). Mode 4 corresponds to the case where the adjusting and refocusing is performed at constant E2 and Vs by adjusting the potential Vint at an intermediate element 555 (as described above with reference to FIG. 17).

In the example modeled implementation represented by the graph, the correction range of mode 1 is limited to E1 in a range between 99% and 101%. This is because the model assumed that a detector would need to be moved in response to the sample movement and that this movement would be limited to a shift of −5 micron to +5 micron. Movement of the detector does not change the principle of operation of mode 1, although the potentials applied to achieve the desired control, e.g. of E2, will be different.

The correction range for mode 3 is limited to E1 between 100% and 103.3% because of a desire to avoid the field E2 on the sample falling outside of the range of 1 kV/mm to 2.7 kV/mm. The range of the field E2 ensures that the detection efficiency is sufficiently high for a meaningful signal (i.e. not too low) and avoids damage to the sample which could occur in an excessively high field E2.

For modes 2 and 4, the entire range of 90% to 110% of E1 can be covered. Mode 4 is more complicated than mode 2 but avoids varying landing energy. An operator would have optimal control of the landing energy and thus control of an important parameter during operation. Additionally, mode 4 has a smaller impact on resolution than mode 2, although the performance of mode 2 is still acceptable for many applications.

As described above, the assessment system may comprise a controller 500 for controlling operation of the system. In the case of the methods described above with reference to FIG. 11-18 particularly, the controller may be configured to cause the system to perform any of the methods by controlling potentials applied to the electrodes 503, 504 and/or intermediate element 555, and/or by controlling the stage.

An alternative approach for reducing or avoiding an effect of electrode distortion would be to make the electrodes of the objective lens array thicker. Thicker electrodes are stronger and therefore distort less for a given electrostatic pressure. If the electrode distortion could be reduced by a factor of 10, this would mean that electrode distortion would only need to be reproducible between different manufactured instances of the objective lens array to within 10% tolerance without any need for the fine tuning described above with reference to FIG. 11-18. In an example implementation, it is expected that reducing electrode distortion by a factor of 10 would require that electrodes are at least three times as thick, for example about 210% thicker. A 200 micron thick electrode would thus become 430 micron thick. This would lead to an increase in resolution of about 0.3 nm at 2.5 keV landing energy. Reducing the electrode distortion by a factor of 100, such that no hardware correction for field curvature (by varying aperture sizes) is even needed, would require that the electrodes are at least five time as thick, for example the elected are made 430% thicker. A 200 micron thick electrode would thus become 730 micron thick. This would lead to an increase of the resolution of about 0.9 nm at 2.5 keV landing energy.

For arrangements of the type having an electron-optical design as depicted in FIG. 10 (comprising a macro collimator 270), a substantial amount of field curvature originates from the macro collimator 270. The magnitude of this field curvature at the sample 208 may typically be in the range of 1 to 3 micron depending on the magnification used (which may be set by the control lens array 250). The field curvature due to the macro collimator 270 may thus be larger than the field curvature due to electrode distortion in the objective lens array 241. Variations in the electrode distortion could thus be compensated by optimizing the magnification (using the control lens array 250). The field curvature from the macro collimator and field curvature from the electrode distortion have opposite sign and so at least partly cancel out.

References to upper and lower, up and down, above and below, etc. in relation to embodiments containing or using a particle trap should be understood as referring to directions parallel to the (typically but not always vertical) up-beam and down-beam directions of the electron beam or multi-beam impinging on the sample 208. Thus, references to up beam and down beam are intended to refer to directions in respect of the beam path independently of any present gravitational field.

The embodiments herein described may take the form of a series of aperture arrays or electron-optical elements arranged in arrays along a beam or a multi-beam path. Such electron-optical elements may be electrostatic. In some embodiments, all the electron-optical elements, for example from a beam limiting aperture array to a last electron-optical element in a sub-beam path before a sample, may be electrostatic and/or may be in the form of an aperture array or a plate array. In some arrangements one or more of the electron-optical elements are manufactured as a microelectromechanical system (MEMS) (i.e. using MEMS manufacturing techniques). Electron-optical elements may have magnetic elements and electrostatic elements. For example, a compound array lens may feature a macro magnetic lens encompassing the multi-beam path with an upper and lower pole plate within the magnetic lens and arranged along the multi-beam path. In the pole plates may be an array of apertures for the beam paths of the multi-beam. Electrodes may be present above, below or between the pole plates to control and optimize the electromagnetic field of the compound lens array.

Where electrodes or other elements are provided that can be set to different potentials relative to each other it will be understood that such electrodes/elements will be electrically isolated from each other. If the electrodes/elements are mechanically connected to each other, electrically insulating connectors may be provided. For example, where electrodes/elements are provided as a series of conductive plates that each define an aperture array, for example to form an objective lens array or control lens array, electrically insulating plates may be provided between the conductive plates.

The insulating plates may be connected to the conductive plates and thereby act as insulating connectors. The conductive plates may be separated from each other along sub-beam paths by the insulating plates.

An assessment tool or assessment system according to the disclosure may comprise apparatus which makes a qualitative assessment of a sample (e.g. pass/fail), one which makes a quantitative measurement (e.g. the size of a feature) of a sample or one which generates an image of map of a sample. Examples of assessment tools or systems are inspection tools (e.g. for identifying defects), review tools (e.g. for classifying defects) and metrology tools, or tools capable of performing any combination of assessment functionalities associated with inspection tools, review tools, or metrology tools (e.g. metro-inspection tools).

Reference to a component or system of components or elements being controllable to manipulate a charged particle beam in a certain manner includes configuring a controller or control system or control unit to control the component to manipulate the charged particle beam in the manner described, as well optionally using other controllers or devices (e.g. voltage supplies) to control the component to manipulate the charged particle beam in this manner. For example, a voltage supply may be electrically connected to one or more components to apply potentials to the components, such as to the electrodes of the control lens array 250 and objective lens array 241, under the control of the controller or control system or control unit. An actuatable component, such as a stage, may be controllable to actuate and thus move relative to another components such as the beam path using one or more controllers, control systems, or control units to control the actuation of the component.

Functionality provided by the controller or control system or control unit may be computer-implemented. Any suitable combination of elements may be used to provide the required functionality, including for example CPUs, RAM, SSDs, motherboards, network connections, firmware, software, and/or other elements known in the art that allow the required computing operations to be performed. The required computing operations may be defined by one or more computer programs. The one or more computer programs may be provided in the form of media, optionally non-transitory media, storing computer readable instructions. When the computer readable instructions are read by the computer, the computer performs the required method steps. The computer may consist of a self-contained unit or a distributed computing system having plural different computers connected to each other via a network.

The terms "sub-beam" and "beamlet" are used interchangeably herein and are both understood to encompass any radiation beam derived from a parent radiation beam by dividing or splitting the parent radiation beam. The term "manipulator" is used to encompass any element which affects the path of a sub-beam or beamlet, such as a lens or deflector. References to elements being aligned along a beam path or sub-beam path are understood to mean that the respective elements are positioned along the beam path or sub-beam path. References to optics are understood to mean electron-optics.

According to some embodiments of the present disclosure, there is provided an assessment system configured to direct charged particles in sub-beams arranged in a multi-beam towards a sample, the system comprising: a plurality of electrodes defining an objective lens array configured to direct the sub-beams onto a sample, the electrodes being arranged in series along at least one sub-beam path of the sub-beams; a stage for supporting a sample; and a controller configured to control potentials applied to the electrodes and/or control the stage to cause the system to perform the disclosed method.

According to some embodiments of the present disclosure, there is provided an assessment system configured to direct charged particles in sub-beams arranged in a multi-beam towards a sample, the system comprising: a plurality of electrodes defining an objective lens array configured to direct the sub-beams onto a sample, the electrodes being arranged in series along at least one sub-beam path of the sub-beams; a stage for supporting a sample; and an intermediate element positioned between the objective lens array and the stage, the intermediate element being electrically isolated from both the objective lens array and the stage.

According to some embodiments of the present disclosure, there is provided a computer-implemented method of controlling an assessment system configured to direct charged particles in sub-beams arranged in a multi-beam towards a sample, the system comprising a plurality of electrodes defining an objective lens array configured to direct the sub-beams onto a sample, the electrodes being arranged in series along at least one sub-beam path of the sub-beams, and a stage for supporting a sample, the method comprising controlling potentials applied to the electrodes and/or controlling the stage to cause the system to perform the disclosed method.

While the present invention has been described in connection with various embodiments, other embodiments of the invention will be apparent to those skilled in the art from consideration of the specification and practice of the technology disclosed herein. It is intended that the specification and examples be considered as exemplary only, with a true scope and spirit of the invention being indicated by the following claims and clauses.

There is provided the following clauses. Clause 1: A method of compensating for an effect of electrode distortion in an objective lens array of a multi-beam charged particle assessment system, the method comprising: adjusting an electrode distortion by varying an electrostatic field in the objective lens array, the adjustment being such as to compensate for an effect of electrode distortion on sub-beams of the multi-beam impinging on a sample; and refocusing a sub-beam of the multi-beam in response to the variation in electrostatic field in the objective lens array, wherein: the adjusting and the refocusing comprises changing potentials applied to two electrodes of the objective lens array.

Clause 2: The method of clause 1, wherein one of the two electrodes is an electrode of the objective lens of the objective lens array that applies the strongest lensing effect to the sub-beam compared to other electrodes of the objective lens.

Clause 3: The method of clause 1 or 2, wherein one of the two electrodes is an electrode of the objective lens of the objective lens array that acts on the sub-beam and is closest to the sample compared to other electrodes of the objective lens.

Clause 4: The method of any preceding clause, wherein an electric field at the sample is kept constant during the adjusting and the refocusing.

Clause 5: The method of any preceding clause, wherein a potential at the sample is controlled to maintain a constant landing energy during the adjusting and the refocusing.

Clause 6: The method of any preceding clause, wherein the refocusing comprises varying a distance between the sample and the objective lens array.

Clause 7: The method of any preceding clause, wherein the adjusting and the refocusing comprises changing a potential applied to an intermediate element to create or change an electric field between the intermediate element and the objective lens acting on the sub-beam, the intermediate element being between the sample and the objective lens.

Clause 8: The method of clause 7, wherein the intermediate element comprises or supports a detector for detecting signal electrons emitted from the sample.

Clause 9: The method of clause 4, wherein a potential at the sample is allowed to vary during the adjustment and the refocusing.

Clause 10: The method of clause 5, wherein an electric field at the sample is allowed to vary during the adjusting and the refocusing.

Clause 11: The method of any preceding clause, wherein the adjusting and the refocusing comprises adjusting at least two, preferably three or at least four degrees of freedom.

Clause 12: The method of any preceding clause, wherein at least a majority of the electrode distortion is caused by electrostatic pressure.

Clause 13: The method of any preceding clause, wherein the electrode distortion comprises a change in shape and/or position of one or more electrodes in the objective lens array.

Clause 14: The method of any preceding clause, wherein the compensated effect on the sub-beams comprises field curvature.

Clause 15: The method of any preceding clause, wherein: the objective lens array comprises a hardware correction for compensating a predicted effect on the sub-beams from a predicted electrode distortion in the objective lens array; and the adjustment of the electrode distortion comprises adjusting the electrode distortion to substantially match the predicted electrode distortion.

Clause 16: The method of clause 15, wherein the predicted electrode distortion is a target electrode distortion for achieving a desired effect on the electron-optical characteristics of the sub-beams of the multi-beam.

Clause 17: The method of clause 15 or 16, wherein the hardware correction comprises a variation in size of apertures defined in one or more of the electrodes as a function of position in each electrode.

Clause 18: The method of any preceding clause, wherein the electrodes comprise conductive plates in series along sub-beam paths, each plate defining apertures aligned with the sub-beam paths.

Clause 19: The method of any preceding clause, wherein the objective lens array comprises multiple electrodes in each of which is defined a plurality of apertures for the passage of the multi-beam, the electrodes preferably being two-dimensional substrates.

Clause 20: An assessment system configured to direct charged particles in sub-beams arranged in a multi-beam towards a sample, the system comprising: a plurality of electrodes defining an objective lens array configured to direct the sub-beams onto a sample, the electrodes being arranged in series along at least one sub-beam path of the sub-beams; a stage for supporting a sample; and a controller configured to control potentials applied to the electrodes and/or control the stage to cause the system to perform the method of any preceding clause.

Clause 21: An assessment system configured to direct charged particles in sub-beams arranged in a multi-beam towards a sample, the system comprising: a plurality of electrodes defining an objective lens array configured to direct the sub-beams onto a sample, the electrodes being arranged in series along at least one sub-beam path of the sub-beams; a stage for supporting a sample; and an intermediate element positioned between the objective lens array and the stage, the intermediate element being electrically isolated from both the objective lens array and the stage.

Clause 22: The system of clause 21, wherein the intermediate element comprises or supports a detector configured to detect signal electrons emitted from the sample.

Clause 23: The system of clause 21 or 22, further comprising a controller configured to apply a different electrostatic potential to the intermediate element than to an electrode of the objective lens array configured to be closest to the sample.

Clause 24: The system of clause 23, wherein the controller is configured to compensate for an effect of electrode distortion in the objective lens array by adjusting an electrode distortion, the controller being configured to perform the adjustment of the electrode distortion by varying an electrostatic field in the objective lens array.

Clause 25: The system of clause 24, wherein the controller is further configured to refocus a sub-beam of the multi-beam in response to the variation in electrostatic field in the objective lens array.

Clause 26: The system of clause 25, wherein the controller is configured to refocus the sub-beam by adjusting a potential applied to two of the electrodes of the objective lens array.

Clause 27: The system of clause 26, wherein the controller is configured such that the adjusting and the refocusing comprises changing potentials applied to two of the electrodes defining the objective lens array and to the intermediate element.

Clause 28: A computer-implemented method of controlling an assessment system configured to direct charged particles in sub-beams arranged in a multi-beam towards a sample, the system comprising a plurality of electrodes defining an objective lens array configured to direct the sub-beams onto a sample, the electrodes being arranged in series along at least one sub-beam path of the sub-beams, and a stage for supporting a sample, the method comprising controlling potentials applied to the electrodes and/or controlling the stage to cause the system to perform the method of any of clauses 1-19.

Clause 29: A computer program product comprising instructions which, when the program is executed by a computer, cause the computer to carry out the method of any of clauses 1-19.

The invention claimed is:

1. A method of compensating for an effect of electrode distortion in an objective lens array of a multi-beam charged particle assessment system, the method comprising:

adjusting an electrode distortion by varying an electrostatic field in the objective lens array, the objective lens array comprising a hardware correction for compensating a predicted effect on sub-beams from a predicted electrode distortion in the objective lens array, the adjustment being such as to compensate for an effect of electrode distortion on sub-beams of the multi-beam impinging on a sample; and refocusing a sub-beam of the multi-beam in response to the variation in electrostatic field in the objective lens array, wherein:

the adjusting and the refocusing comprises changing potentials applied to two electrodes of the objective lens array and the adjustment of the electrode distortion comprising adjusting the electrode distortion to substantially match the predicted electrode distortion.

2. The method of claim 1, wherein one of the two electrodes is an electrode of the objective lens of the objective lens array that applies the strongest lensing effect to the sub-beam compared to other electrodes of the objective lens.

3. The method of claim 1, wherein one of the two electrodes is an electrode of the objective lens of the objective lens array that acts on the sub-beam and is closest to the sample compared to other electrodes of the objective lens.

4. The method of claim 1, wherein an electric field at the sample is kept constant during the adjusting and the refocusing.

5. The method of claim 1, wherein a potential at the sample is controlled to maintain a constant landing energy during the adjusting and the refocusing.

6. The method of claim 1, wherein the refocusing comprises varying a distance between the sample and the objective lens array.

7. The method of claim 1, wherein the adjusting and the refocusing comprises changing a potential applied to an intermediate element to create or change an electric field between the intermediate element and the objective lens acting on the sub-beam, the intermediate element being between the sample and the objective lens.

8. The method of claim 7, wherein the intermediate element comprises or supports a detector for detecting signal electrons emitted from the sample.

9. The method of claim 4, wherein a potential at the sample is allowed to vary during the adjustment and the refocusing.

10. The method of claim 5, wherein an electric field at the sample is allowed to vary during the adjusting and the refocusing.

11. The method of claim 1, wherein the adjusting and the refocusing comprises adjusting at least two, preferably three or at least four degrees of freedom.

12. The method of claim 1, wherein the electrode distortion comprises a change in shape and/or position of one or more electrodes in the objective lens array.

13. The method of claim 1, wherein the compensated effect on the sub-beams comprises field curvature.

14. The method of claim 1, wherein the predicted electrode distortion is a target electrode distortion for achieving a desired effect on electron-optical characteristics of the sub-beams of the multi-beam.

15. The method of claim 1, wherein at least a majority of the electrode distortion is caused by electrostatic pressure.

16. An assessment system configured to direct charged particles in sub-beams arranged in a multi-beam towards a sample, the system comprising:
a plurality of electrodes defining an objective lens array configured to direct the sub-beams onto a sample, the electrodes being arranged in series along at least one sub-beam path of the sub-beams;
a stage for supporting a sample; and
an intermediate element positioned between the objective lens array and the stage, the intermediate element being electrically isolated from both the objective lens array and the stage.

17. The system of claim 16, further comprising a controller configured to apply a different electrostatic potential to the intermediate element than to an electrode of the objective lens array configured to be closest to the sample.

18. The system of claim 17, wherein the controller is configured to compensate for an effect of electrode distortion in the objective lens array by adjusting an electrode distortion, the controller being configured to perform the adjustment of the electrode distortion by varying an electrostatic field in the objective lens array.

19. The system of claim 18, wherein the controller is further configured to refocus a sub-beam of the multi-beam in response to the variation in electrostatic field in the objective lens array.

20. A computer-implemented method of controlling an assessment system configured to direct charged particles in sub-beams arranged in a multi-beam towards a sample, the system comprising a plurality of electrodes defining an objective lens array configured to direct the sub-beams onto a sample, the electrodes being arranged in series along at least one sub-beam path of the sub-beams, and a stage for supporting a sample, the method comprising controlling potentials applied to the electrodes and/or controlling the stage to cause the system to perform the method claim 1.

* * * * *